(12) United States Patent
Nosaka

(10) Patent No.: US 11,031,921 B2
(45) Date of Patent: Jun. 8, 2021

(54) ACOUSTIC WAVE FILTER DEVICE, DUPLEXER, RADIO FREQUENCY FRONT END CIRCUIT AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 83 days.

(21) Appl. No.: 16/590,579

(22) Filed: Oct. 2, 2019

(65) Prior Publication Data
US 2020/0036365 A1    Jan. 30, 2020

Related U.S. Application Data

(63) Continuation of application No. PCT/JP2018/012229, filed on Mar. 26, 2018.

(30) Foreign Application Priority Data

Apr. 3, 2017    (JP) .............................. JP2017-073945

(51) Int. Cl.
*H03H 9/64* (2006.01)
*H03H 9/00* (2006.01)
*H03H 9/02* (2006.01)
(Continued)

(52) U.S. Cl.
CPC ........ *H03H 9/6483* (2013.01); *H03H 9/0014* (2013.01); *H03H 9/02007* (2013.01);
(Continued)

(58) Field of Classification Search
CPC .............. H03H 9/6483; H03H 9/0014; H03H 9/02007; H03H 9/0571; H03H 9/706; H03H 9/725
(Continued)

(56) References Cited

U.S. PATENT DOCUMENTS 10,200,012 B2    2/2019    Tsukamoto
2009/0201104 A1   8/2009    Ueda et al.
(Continued)

FOREIGN PATENT DOCUMENTS

JP    H10-336000 A    12/1998
JP    2008-219748 A   9/2008
(Continued)

OTHER PUBLICATIONS

International Search Report Issued in Patent Application No. PCT/JP2018/012229 dated May 22, 2018.
(Continued)

*Primary Examiner* — Benny T Lee
*Assistant Examiner* — Hafizur Rahman
(74) *Attorney, Agent, or Firm* — Pearne & Gordon LLP

(57) ABSTRACT

The acoustic wave filter (10A) includes a parallel-arm resonant circuit (12p). The parallel-arm resonant circuit (12p) includes a parallel-arm resonator (p1) and a frequency variable circuit (72p) that are connected in parallel. The frequency variable circuit (72p) includes a parallel-arm resonator (p2) that has a resonant frequency higher than that of the parallel-arm resonator (p1) and a switch (SW1) element. A frequency difference between a resonant frequency on a higher frequency side of the parallel-arm resonant circuit (12p) in a case where the switch (SW1) is OFF and a resonant frequency on a higher frequency side of the parallel-arm resonant circuit (12p) in a case where the switch (SW1) is ON is equal to or more than a frequency difference between a low frequency end frequency of the second attenuation band and a low frequency end frequency of the first attenuation band.

20 Claims, 20 Drawing Sheets

(51) Int. Cl.
  *H03H 9/05* (2006.01)
  *H03H 9/70* (2006.01)
  *H03H 9/72* (2006.01)

(52) U.S. Cl.
  CPC .......... *H03H 9/0571* (2013.01); *H03H 9/706* (2013.01); *H03H 9/725* (2013.01)

(58) Field of Classification Search
  USPC ....................................................... 333/193
  See application file for complete search history.

(56) References Cited

U.S. PATENT DOCUMENTS

2009/0251235 A1  10/2009  Belot et al.
2010/0110940 A1  5/2010  Hara et al.
2016/0301383 A1  10/2016  Tani
2019/0097606 A1  3/2019  Nosaka et al.

FOREIGN PATENT DOCUMENTS

| JP | 2009-207116 A | 9/2009 |
| JP | 2016-054374 A | 4/2016 |
| WO | 2009-025055 A1 | 2/2009 |
| WO | 2015-099105 A1 | 7/2015 |
| WO | 2016-158953 A1 | 10/2016 |
| WO | 2017-138540 A1 | 8/2017 |

OTHER PUBLICATIONS

Written Opinion Issued in Patent Application No. PCT/JP2018/012229 dated May 22, 2018.

FIG. 11B EQUIVALENT CIRCUIT OF PATH 2 WHEN SW IS ON

FIG. 11C EQUIVALENT CIRCUIT OF PATH 2 WHEN SW IS OFF

FIG. 11D EQUIVALENT CIRCUIT OF Reso1 (PATH 1)

FIG. 11E EQUIVALENT CIRCUIT WHEN SW IS ON

FIG. 11F EQUIVALENT CIRCUIT WHEN SW IS OFF

ACOUSTIC WAVE FILTER DEVICE, DUPLEXER, RADIO FREQUENCY FRONT END CIRCUIT AND COMMUNICATION APPARATUS

This is a continuation of International Application No. PCT/JP2018/012229 filed on Mar. 26, 2018 which claims priority from Japanese Patent Application No. 2017-073945 filed on Apr. 3, 2017. The contents of these applications are incorporated herein by reference in their entireties.

BACKGROUND OF THE DISCLOSURE

Field of the Disclosure

The present disclosure relates to an acoustic wave filter device including a resonator, a duplexer, a radio frequency front end circuit, and a communication apparatus.

Description of the Related Art

Acoustic wave filters using acoustic waves have been widely used as band pass filters arranged in a front end unit of mobile communication equipment. Furthermore, to support multiple modes/multiple bands and the like, radio frequency front end circuits including multiple acoustic wave filters have been put into practical use.

In Patent Document 1, a frequency-variable acoustic wave filter that includes a series-arm circuit or a parallel-arm circuit including multiple acoustic wave resonators having different resonant frequencies and different anti-resonant frequencies is disclosed. More specifically, by short-circuiting or releasing an acoustic wave resonator by switching between conduction and non-conduction of a switch element and varying a resonant frequency or anti-resonant frequency of the series-arm circuit or the parallel-arm circuit, a pass band and an attenuation band of the acoustic wave filter vary.

Patent Document 1: Japanese Unexamined Patent Application Publication No. 2009-207116

BRIEF SUMMARY OF THE DISCLOSURE

However, in a frequency variable circuit that includes a series circuit including an acoustic wave resonator and a switch element, like the acoustic wave filter disclosed in Patent Document 1, as an off capacitance, which is a capacitance component at the time of non-conduction of the switch element, increases, the resonant frequency of the frequency variable circuit at the time of non-conduction is shifted toward lower frequencies. Therefore, there is a problem in that the amount of frequency shift of an attenuation pole of the acoustic wave filter by switching between conduction and non-conduction of the switch element decreases. Furthermore, another problem also occurs in that the pass band width of the acoustic wave filter at the time of non-conduction of the switch element decreases.

Thus, the present disclosure has been made to solve the above-mentioned problems, and an object of the present disclosure is to provide an acoustic wave filter device, a duplexer, a radio frequency front end circuit, and a communication apparatus that are able to switch between the signal paths of two frequency bands while ensuring a sufficient amount of frequency shift of an attenuation band.

In order to achieve the above object, an acoustic wave filter device according to an aspect of the present disclosure varies first filter characteristics that transmit a radio frequency signal in a first pass band and attenuate a radio frequency signal in a first attenuation band allocated to a higher frequency side than the first pass band and second filter characteristics that transmit a radio frequency signal in a second pass band that is allocated to a higher frequency side than the first pass band and attenuate a radio frequency signal in a second attenuation band allocated to a higher frequency side than the second pass band. The acoustic wave filter device includes a series-arm circuit that is connected between a first input/output terminal and a second input/output terminal; and a parallel-arm resonant circuit that is connected to a node on a path connecting the first input/output terminal to the second input/output terminal and a ground. The parallel-arm resonant circuit includes a first acoustic wave resonator, and a frequency variable circuit that is connected in parallel with the first acoustic wave resonator and has a function for varying a resonant frequency and an anti-resonant frequency of the parallel-arm resonant circuit. The frequency variable circuit includes a second acoustic wave resonator that has a resonant frequency higher than a resonant frequency of the first acoustic wave resonator and an anti-resonant frequency higher than an anti-resonant frequency of the first acoustic wave resonator, and a switch element that is connected in series with the second acoustic wave resonator. Switching between the first filter characteristics and the second filter characteristics is performed by switching between conduction and non-conduction of the switch element. A resonant frequency difference, which is a frequency difference between a resonant frequency on a higher frequency side, out of two resonant frequencies of the parallel-arm resonant circuit in a case where the switch element is in a non-conduction state, and a resonant frequency on a higher frequency side, out of two resonant frequencies of the parallel-arm resonant circuit in a case where the switch element is in a conduction state, is equal to or more than an attenuation band frequency difference, which is a frequency difference between a low frequency end frequency in the second attenuation band and a low frequency end frequency in the first attenuation band.

With the above configuration, in the acoustic wave filter device of a band pass type including the series-arm circuit and the parallel-arm resonant circuit, when the switch element is in the conduction state, the first filter characteristics can be achieved by a combined resonator of the series-arm resonator and the first and second acoustic wave resonators. Furthermore, when the switch element is in the non-conduction state, the second filter characteristics can be formed by a combined resonator of the series-arm resonator, the first and second acoustic wave resonators, and the off capacitance.

With the above configuration, the resonant frequency difference is equal to or more than the attenuation band frequency difference. Therefore, the amount of shift of the resonant frequency of the parallel-arm resonant circuit by switching between conduction and non-conduction of the switch element can be increased, and the amount of shift of the frequency of the attenuation pole configured of the resonant frequency can be increased.

Furthermore, the second acoustic wave resonator may be represented by an equivalent circuit in which a series circuit including an inductor having an inductance $L_2$ and a capacitor having an electrostatic capacitance $C_2$ that are connected in series and a capacitor having an electrostatic capacitance $C_{02}$ are connected in parallel. In a case where the attenuation band frequency difference is represented by $\Delta f_{FIL}$, an off capacitance $C_{off}$, which is an electrostatic capacitance of the switch element in the case where the switch element is in the non-conduction state, may satisfy a relational expression:

[Math. 1]
$$C_{off} \le \frac{L_2 C_{02} C_2 \left(2\pi\Delta f_{FIL} + \frac{1}{\sqrt{L_2 C_2}}\right)^2 - C_{02} - C_2}{1 - L_2 C_2 \left(2\pi\Delta f_{FIL} + \frac{1}{\sqrt{L_2 C_2}}\right)^2}.$$

With this configuration, the acoustic wave resonator is represented by the equivalent circuit including the inductor and the capacitor. Therefore, the size of the off capacitance for ensuring a large amount of shift of the frequency of the attenuation pole configured of the resonant frequency of the parallel-arm resonant circuit can be defined.

Furthermore, the off capacitance $C_{off}$ may be smaller than the electrostatic capacitance $C_{02}$.

Accordingly, the pass band width in the case where the switch element is in the non-conduction state can be increased, and insertion loss can be reduced.

Furthermore, the series-arm circuit may include a series-arm resonator that is connected between the first input/output terminal and the second input/output terminal. The resonant frequency of the first acoustic wave resonator may be lower than a resonant frequency of the series-arm resonator. The resonant frequency of the second acoustic wave resonator may be higher than the resonant frequency of the first acoustic wave resonator.

With the above configuration in the case where the switch element is in the conduction state, one of the two resonant frequencies of the parallel-arm resonant circuit serves as the resonant frequency of the first acoustic wave resonator, the other one of the two resonant frequencies serves as the resonant frequency of the second acoustic wave resonator, one of the two anti-resonant frequencies of the parallel-arm resonant circuit is lower than the resonant frequency of the first acoustic wave resonator, and the other one of the two anti-resonant frequencies is lower than the resonant frequency of the second acoustic wave resonator. In contrast, in the case where the switch element is in the non-conduction state, one of the two resonant frequencies of the parallel-arm resonant circuit serves as the resonant frequency of the first acoustic wave resonator, the other one of the two resonant frequencies is higher than the resonant frequency of the second acoustic wave resonator, and one and the other one of the two anti-resonant frequencies of the parallel-arm resonant circuit are higher than one and the other one of the two anti-resonant frequencies in the case where the switch element is in the conduction state, respectively. Therefore, by switching between conduction and non-conduction of the switch element, switching of the pass band width and the frequency of the attenuation pole on the higher frequency side of the pass band can be performed. That is, by switching of the switch element, the pass band of the filter circuit can be adjusted. Conventionally, a filter circuit that is applied to a system for exclusively selecting two bands has required two filter circuits and an SPDT switch for switching between the two filters. In contrast, with this configuration, a filter circuit and a switch element of an SPST (Single Pole Single Throw) type are provided. Thus, simplification and miniaturization of a filter circuit can be achieved.

The resonant frequency of the second acoustic wave resonator may be higher than the resonant frequency of the series-arm resonator and lower than an anti-resonant frequency of the series-arm resonator.

With this configuration, the resonant frequency of the second acoustic wave resonator is higher than the resonant frequency of the series-arm resonator that affects insertion loss in the vicinity of the center frequency in the pass band and lower than the anti-resonant frequency of the series-arm resonator corresponding to the attenuation pole on the higher frequency side outside the pass band. Accordingly, in the case where the switch element is electrically connected, the attenuation pole on the higher frequency side outside the pass band can be shifted toward lower frequencies while low-loss characteristics in the pass band is maintained. Thus, in the case where the switch element is electrically connected, the radio frequency end of the pass band can be shifted toward lower frequencies, and the pass band width can thus be reduced without steepness of the transmission characteristics being impaired.

The acoustic wave filter device may include a plurality of stages of filter structure, each of the plurality of stages including a series-arm circuit and a parallel-arm circuit. Two or more of the plurality of parallel-arm circuits may be the parallel-arm resonant circuits each including the first acoustic wave resonator, the second acoustic wave resonator, and the switch element.

Accordingly, in the pass band characteristics defined by the plurality of stages of ladder filter structure, a fine adjustment of the band width can be achieved by selecting, in a desired manner, a switch element to be electrically connected.

The frequency variable circuit configured such that the second acoustic wave resonator and the switch element are connected in series may be provided in plural, and the plurality of frequency variable circuits may be connected in parallel between the node and the ground.

Accordingly, in the second filter characteristics defined by the series-arm resonator and the first acoustic wave resonator, a fine adjustment of the band width can be achieved by selecting, in a desired manner, a frequency variable circuit to be electrically connected, from among the plurality of frequency variable circuits each including the second acoustic wave resonator and the switch element.

The acoustic wave filter device may further include a longitudinally-coupled filter circuit that is arranged between the first input/output terminal and the second input/output terminal.

Accordingly, attenuation characteristics outside the pass band can be improved.

The first acoustic wave resonator and the second acoustic wave resonator may be surface acoustic wave resonators or acoustic wave resonators using a BAW resonator.

Accordingly, the acoustic wave filter device may be configured of a piezoelectric element using acoustic waves. Therefore, a compact acoustic wave filter device having transmission characteristics with high steepness can be achieved.

Furthermore, the first acoustic wave resonator and the second acoustic wave resonator may include IDT electrodes formed on substrates having same piezoelectric characteristics.

Accordingly, the acoustic wave filter device may be configured of a surface acoustic wave resonator using an IDT electrode. Therefore, a compact and low-profile acoustic wave filter device with transmission characteristics with high steepness can be achieved.

The switch element may be a GaAs or CMOS FET switch or a diode switch.

Accordingly, the switch element may be configured of an FET switch or diode switch. Therefore, a compact acoustic wave filter device can be achieved.

Furthermore, in a duplexer according to an aspect of the present disclosure, one of a transmission-side filter circuit and a reception-side filter circuit may include the acoustic wave filter device according to any one of the above configurations.

Accordingly, in the tunable duplexer that is applied to the system for exclusively selecting two bands that are adjacent to each other, the duplexer may be simplified and miniaturized.

Furthermore, a radio frequency front end circuit according to an aspect of the present disclosure may include the acoustic wave filter device according to the above configuration; and a control unit that controls switching between conduction and non-conduction of the plurality of switch elements. The control unit may control switching between conduction and non-conduction of the plurality of switch elements individually.

Accordingly, in the second filter characteristics defined by the series-arm resonator and the first acoustic wave resonator, transmission characteristics corresponding to three or more frequency bands can be accurately selected by selecting a plurality of switch elements individually.

A radio frequency front end circuit may include a power amplifier that amplifies a radio frequency transmission signal; the acoustic wave filter device according to any one of the above configurations or the duplexer according to the above configuration that transmits the radio frequency transmission signal amplified by the power amplifier; and a control unit that controls switching between conduction and non-conduction of the switch element.

Accordingly, the front end circuit of the transmission system including the power amplifier can be simplified and miniaturized.

Furthermore, a radio frequency front end circuit may include the acoustic wave filter device according to any one of the above configurations or the duplexer according to the above configuration that transmits a radio frequency reception signal received by an antenna element; a low-noise amplifier that amplifies the radio frequency reception signal output from the acoustic wave filter device or the duplexer; and a control unit that controls switching between conduction and non-conduction of the switch element.

Accordingly, the front end circuit of the reception system including the low-noise amplifier can be simplified and miniaturized.

Furthermore, a communication apparatus according to an aspect of the present disclosure includes an RF signal processing circuit that processes a baseband signal or a radio frequency signal; and the radio frequency front end circuit according to any one of the above configurations.

Accordingly, the communication apparatus can be simplified and miniaturized.

According to the present disclosure, an acoustic wave filter device, a duplexer, a radio frequency front end circuit, and a communication apparatus that are able to switch between the signal paths of two frequency bands while a sufficient amount of frequency shift of an attenuation band is ensured by switching between conduction and non-conduction of a switch element can be provided.

Each of FIGS. 11A, 11B, 11C and 11D is a diagram illustrating an equivalent circuit of a parallel-arm resonant circuit.

FIG. 11E is a diagram illustrating an equivalent circuit at the time of conduction of a switch in the parallel-arm resonant circuit.

FIG. 11F is a diagram illustrating an equivalent circuit at the time of non-conduction of the switch in the parallel-arm resonant circuit.

Figure 12:
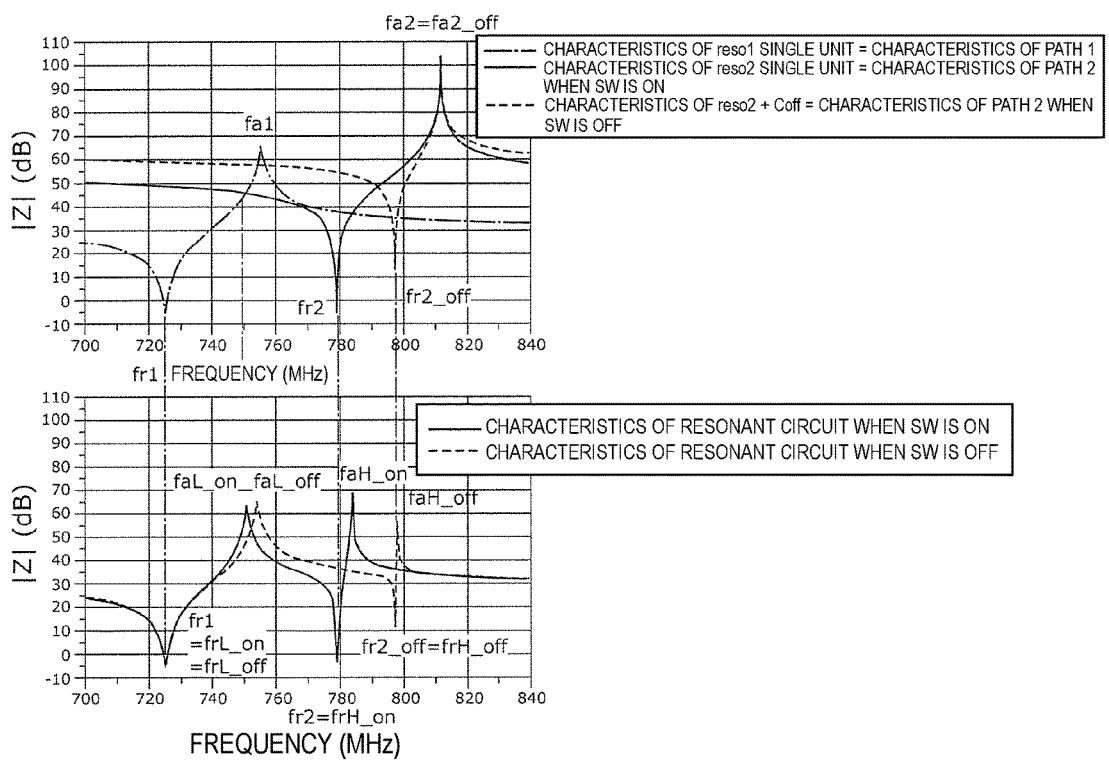

FIG. 12 is a graph indicating impedance characteristics of resonators and a resonant circuit configuring the parallel-arm resonant circuit.

Figure 13A:
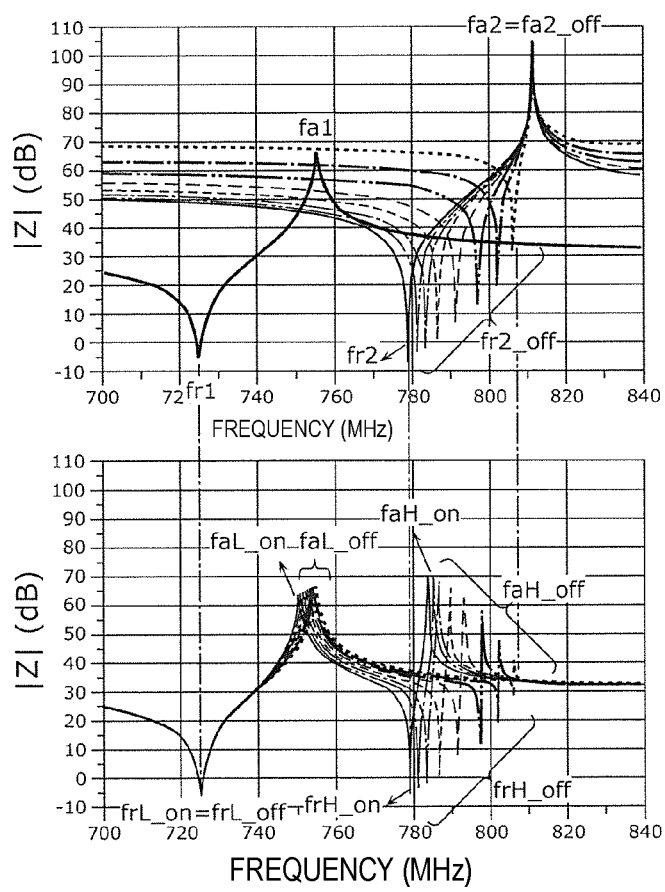

FIG. 13A is a graph indicating the amount of shift of the resonant frequency of the parallel-arm resonant circuit.

Figure 13B:
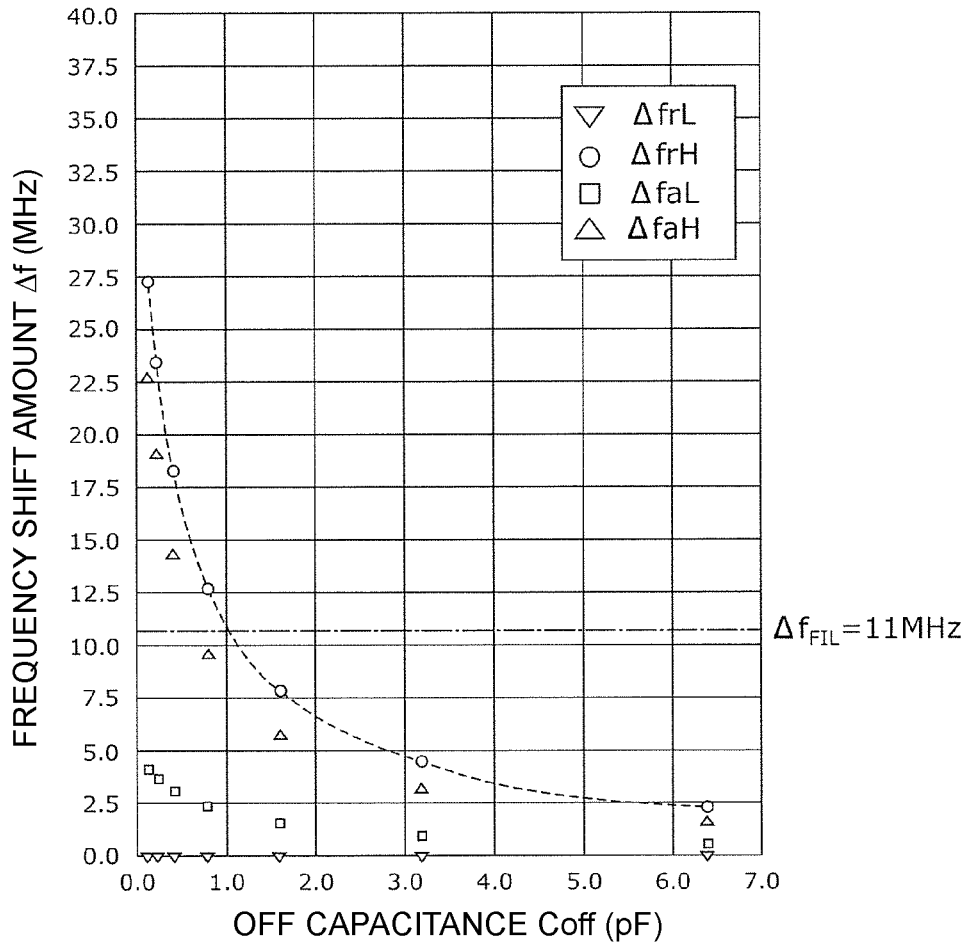

FIG. 13B is a graph indicating the relationship of the off capacitance value and the amount of shift of the resonant frequency of the parallel-arm resonant circuit.

Figure 14:
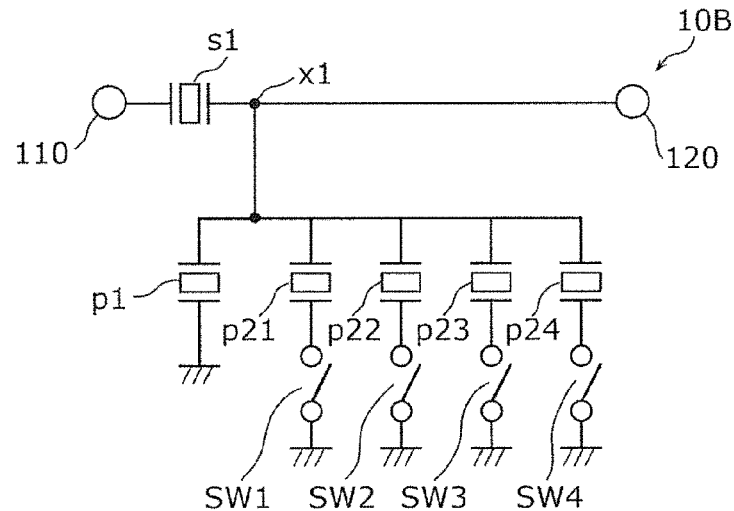

FIG. 14 is a circuit configuration diagram of an acoustic wave filter according to a modification of the first embodiment.

Figure 15:
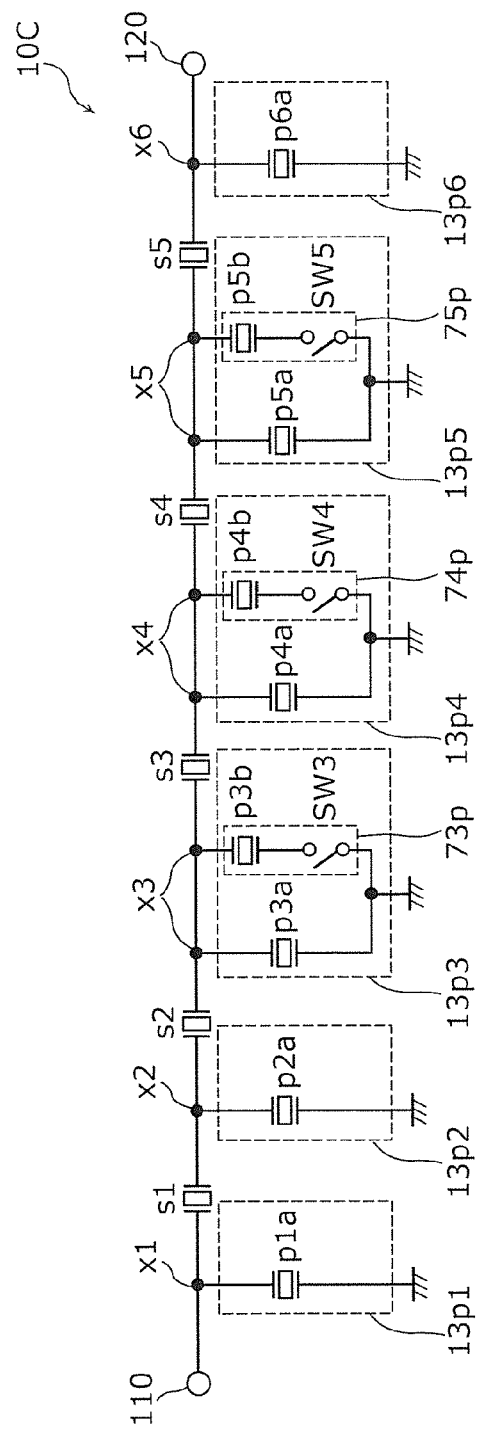

FIG. 15 is a circuit configuration diagram of an acoustic wave filter according to a second embodiment.

Figure 16:
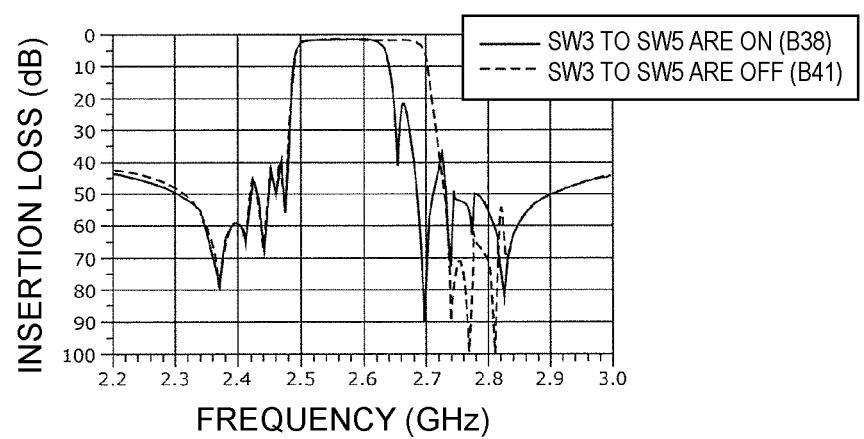

FIG. 16 is a graph indicating transmission characteristics of the acoustic wave filter according to the second embodiment.

Figure 17:
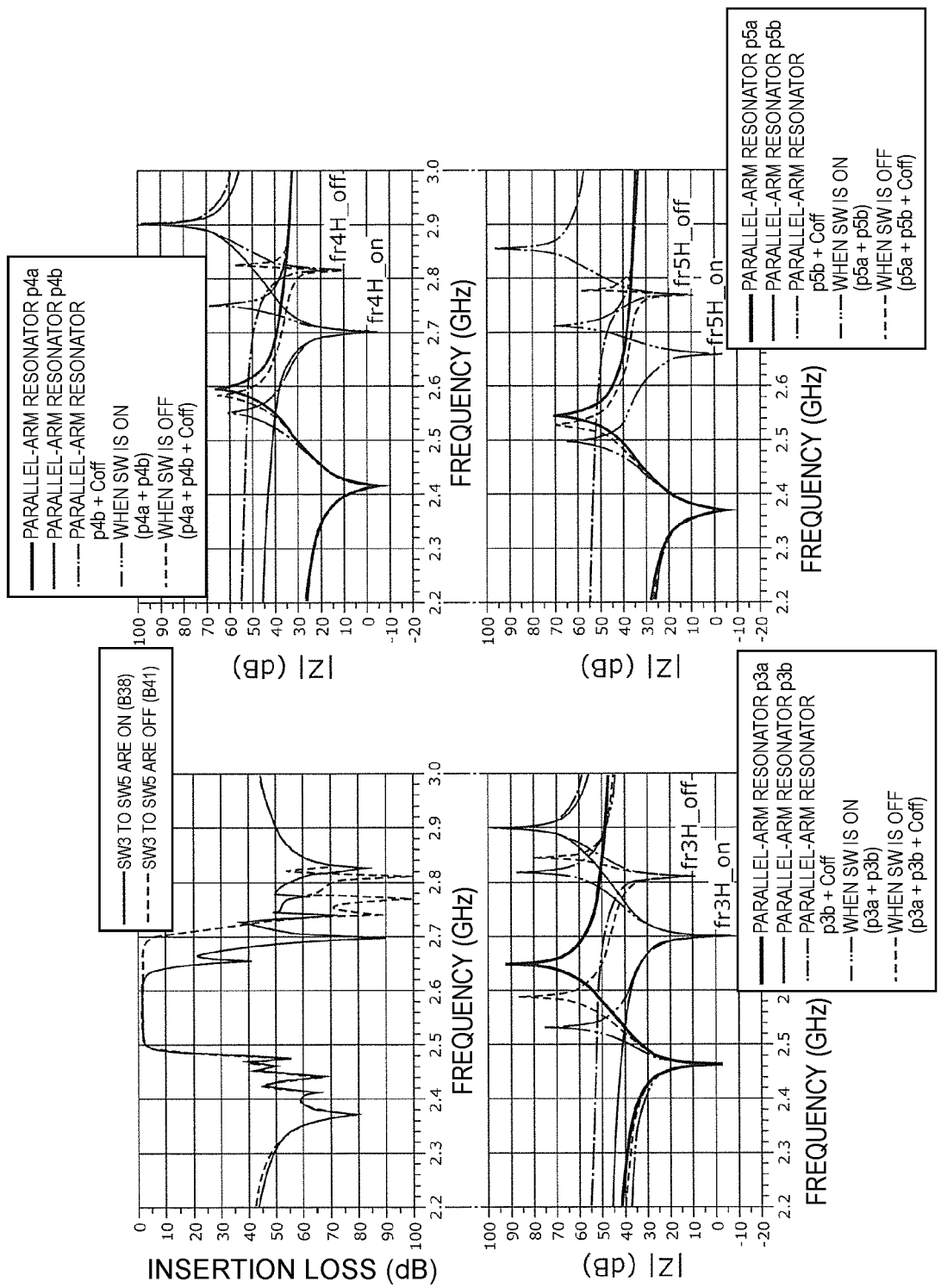

FIG. 17 is a graph indicating transmission characteristics of the acoustic wave filter according to the second embodiment and impedance characteristics of a resonator and a resonant circuit configuring a parallel-arm resonant circuit.

Figure 18:
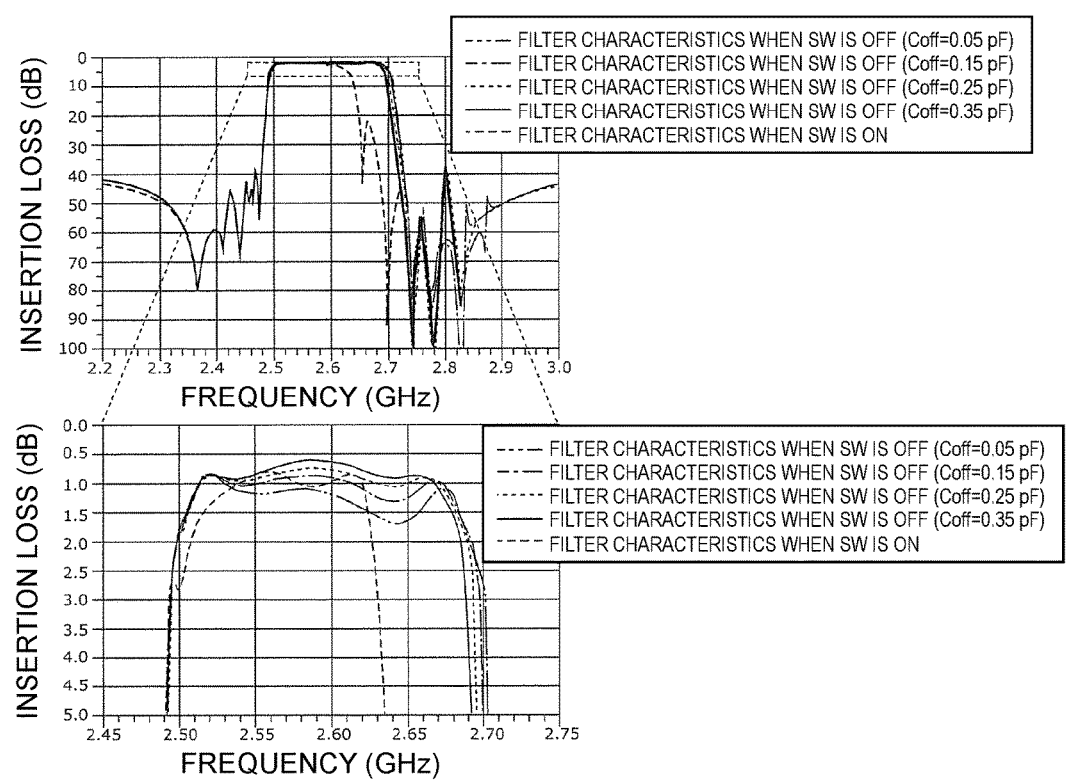

FIG. 18 is a graph indicating comparison of transmission characteristics in the case where the off capacitance of the acoustic wave filter according to the second embodiment is varied.

Figure 19:
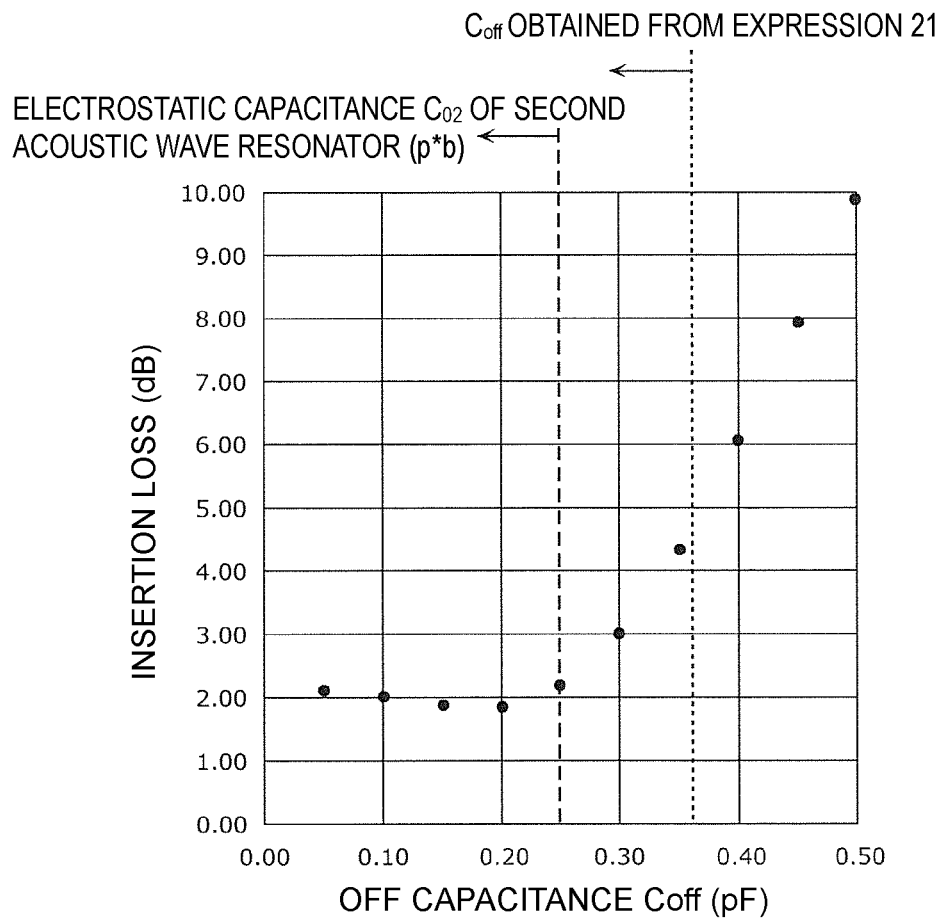

FIG. 19 is a graph indicating the relationship of the off capacitance value and insertion loss of the acoustic wave filter according to the second embodiment.

Figure 20:
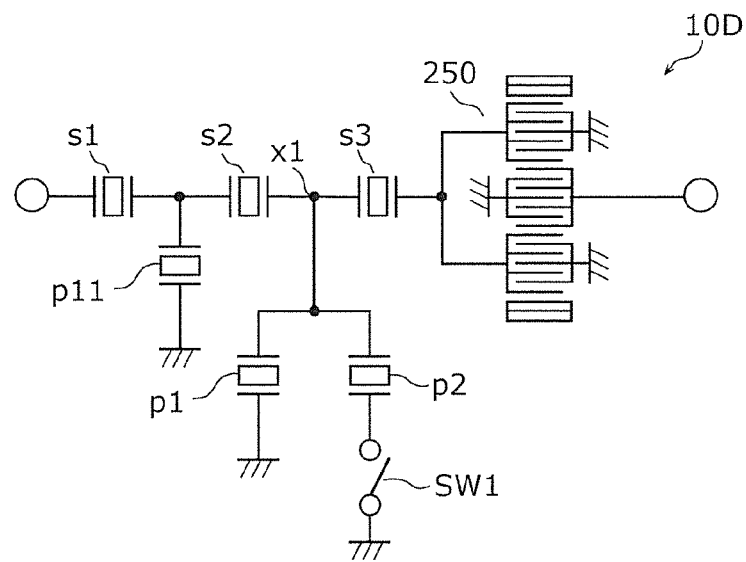

FIG. 20 is a circuit configuration diagram of an acoustic wave filter according to a third embodiment.

Figure 21:
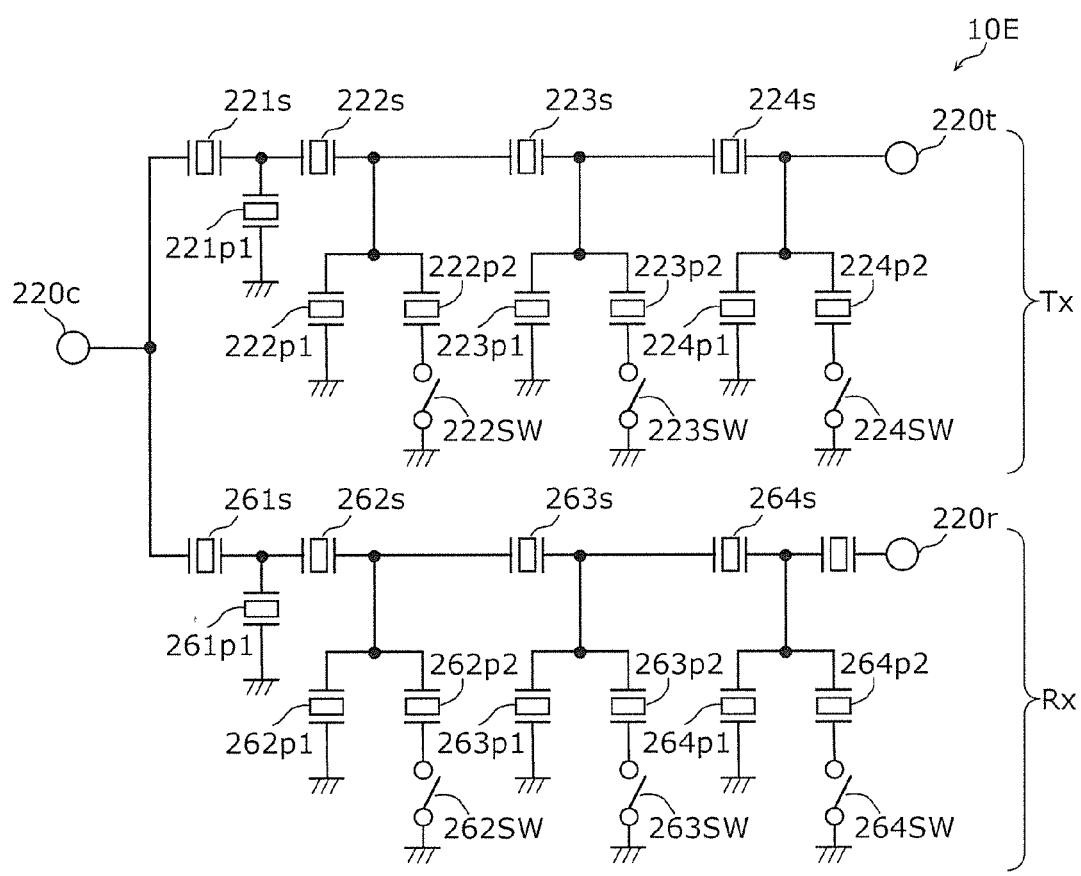

FIG. 21 is a circuit configuration diagram of a duplexer according to a fourth embodiment.

Figure 22:
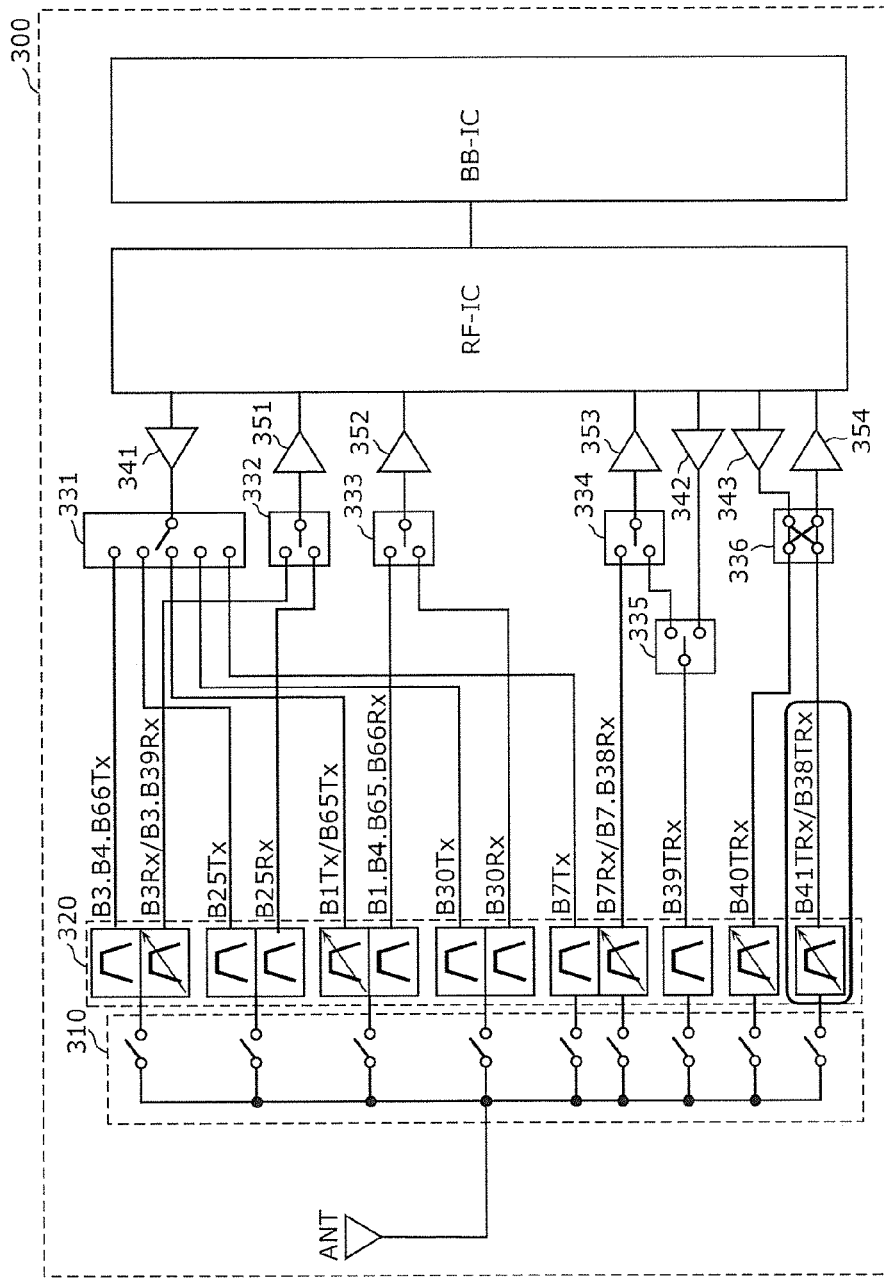

FIG. 22 is a configuration diagram of a communication apparatus according to a fifth embodiment.

DETAILED DESCRIPTION OF THE DISCLOSURE

Hereinafter, embodiments of the present disclosure will be explained in detail with reference to drawings. The embodiments described herein illustrate either general or specific examples. Numerical values, shapes, materials, components, and arrangement and modes of connection of the components described in the embodiments are merely examples, and are not intended to limit the present disclosure. Components in the embodiments, except those described in the independent claims, will be explained as optional components. The sizes or the ratios between the sizes of the components illustrated in the drawings are not strictly correct. Furthermore, in the drawings, the same signs are assigned to substantially the same components, and redundant explanation may be omitted or simplified. Furthermore, constants of circuit elements such as resonators may be adjusted in an appropriate manner in accordance with requirements specification or the like. Therefore, circuit elements with the same signs may have different constants.

Furthermore, a resonant frequency of a resonator or a circuit represents, unless otherwise noted, a resonant frequency for forming an attenuation pole in a pass band or in the vicinity of the pass band of a filter including the resonator or the circuit and the frequency of a "resonance point", which is a singular point at which the impedance of the resonator or the circuit is minimum (ideally, a point with an impedance of 0).

Furthermore, an anti-resonant frequency of a resonator or a circuit represents, unless otherwise noted, an anti-resonant frequency for forming an attenuation pole in a pass band or in the vicinity of the pass band of a filter including the resonator or the circuit and the frequency of an "anti-resonant point" at which the impedance of the resonator or the circuit is maximum (ideally, a point with an infinite impedance).

In the embodiments described below, a series-arm (resonant) circuit and a parallel-arm (resonant) circuit are defined as below.

A parallel-arm (resonant) circuit represents a circuit that is arranged between a node on a path connecting a first input/output terminal to a second input/output terminal and the ground.

A series-arm (resonant) circuit represents a circuit that is arranged between the first input/output terminal or the second input/output terminal and a node on the path to which the parallel-arm (resonant) circuit is connected or arranged between a node on the path to which a parallel-arm (resonant) circuit is connected and another node on the path to which another parallel-arm (resonant) circuit is connected.

First Embodiment

[1.1 Configuration of RF Front End Circuit]

Figure 1:
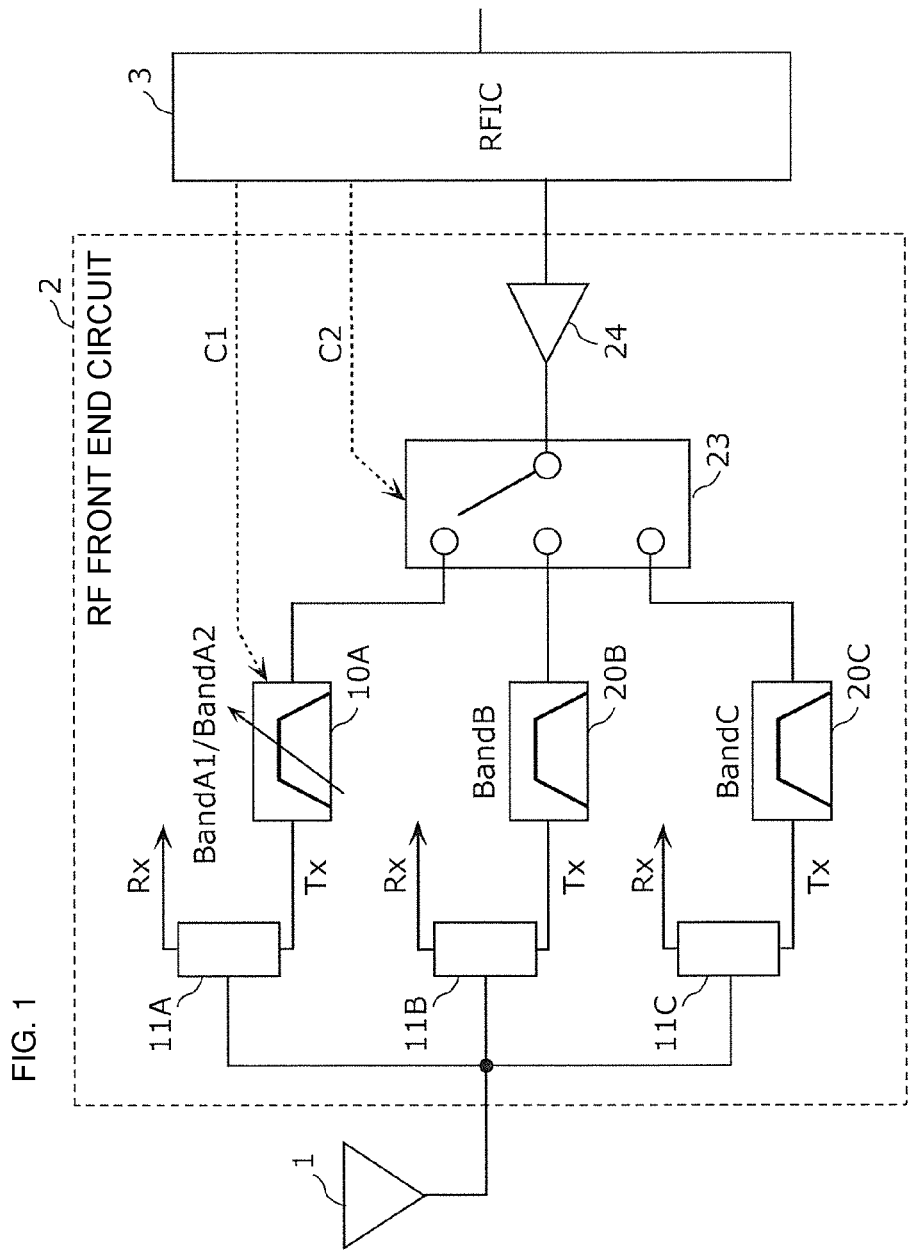
FIG. 1 is a circuit configuration diagram of a radio frequency front end circuit according to a first embodiment.

FIG. 1 is a circuit configuration diagram of an RF front end circuit 2 according to a first embodiment. In FIG. 1, an antenna element 1, the RF front end circuit 2, and an RF signal processing circuit (RFIC) 3 are illustrated. The antenna element 1, the RF front end circuit 2, and the RFIC 3 are arranged, for example, in a front end unit of a cellular phone supporting multiple modes/multiple bands.

For example, the RFIC 3 performs signal processing, by up-conversion or the like, on a baseband transmission signal inputted from a baseband signal processing circuit (not illustrated in the drawing) and outputs a radio frequency transmission signal generated by the signal processing to the RF front end circuit 2. Furthermore, the RFIC 3 functions as a control unit that controls conduction and non-conduction of each switch provided in the RF front end circuit 2, based on a frequency band used.

The RF front end circuit 2 includes switches 11A, 11B, 11C, and 23, an acoustic wave filter 10A, filters 20B and 20C, and a power amplifier 24. Accordingly, the RF front end circuit 2 includes multiple signal paths through which radio frequency signals of predetermined frequency bands pass in a selective manner. Specifically, a radio frequency transmission signal of frequency band (band) A1 or frequency band (band) A2 is outputted to the antenna element 1 through a signal path going through the power amplifier 24, the switch 23, the acoustic wave filter 10A, and the switch 11A. Furthermore, a radio frequency transmission signal of band B is outputted to the antenna element 1 through a signal path going through the power amplifier 24, the switch 23, the filter 20B, and the switch 11B. Furthermore, a radio frequency transmission signal of band C is outputted to the antenna element 1 through a signal path going through the power amplifier 24, the switch 23, the filter 20C, and the switch 11C.

The acoustic wave filter 10A is a principal configuration of the present disclosure and is an acoustic wave filter device that switches between transmission characteristics for transmitting a radio frequency transmission signal of the band A1 and transmission characteristics for transmitting a radio frequency transmission signal of the band A2 in accordance with a control signal C1 for selecting a frequency band.

The filter 20B is a filter element that has transmission characteristics for transmitting a radio frequency transmission signal of the band B.

The filter 20C is a filter element that has transmission characteristics for transmitting a radio frequency transmission signal of the band C.

The switch 23 is a switch of an SP3T (Single Pole Triple Throw) type and is a switch element that switches connection in accordance with a control signal C2 for selecting a frequency band. The switch 23 may be a switch of a SPnT (Single Pole n Throw) type for which the number n of selection terminals is set according to the number of bands set.

Although detailed display of a reception signal path is omitted in FIG. 1, a radio frequency reception signal is outputted from the antenna element 1 to the RFIC 3 through each reception signal path provided in the RF front end circuit 2. Specifically, a radio frequency reception signal of the band A1 or the band A2 is outputted to the RFIC 3 through a signal path going through the antenna element 1, the switch 11A, a reception-side filter circuit (not illustrated in the drawing), and a low-noise amplifier (not illustrated in the drawing). Furthermore, a radio frequency reception signal of the band B is outputted to the RFIC 3 through a signal path going through the antenna element 1, the switch 11B, a reception-side filter circuit (not illustrated in the drawing), and a low-noise amplifier (not illustrated in the drawing). Furthermore, a radio frequency reception signal of the band C is outputted to the RFIC 3 through a signal path going through the antenna element 1, the switch 11C, a reception-side filter circuit (not illustrated in the drawing), and a low-noise amplifier (not illustrated in the drawing).

Although the power amplifier 24 amplifies radio frequency signals of all the bands in FIG. 1, power amplifiers corresponding to individual bands may be arranged.

Furthermore, in FIG. 1, based on the assumption that a time division duplex (TDD) method is used for switching between a transmission path (Tx) and a reception path (Rx), the switches 11A to 11C are arranged. However, the present disclosure is not limited to this configuration. For example, in the case where a duplexer including the filter 20B that transmits a radio frequency transmission signal of the band B in a selective manner and a filter that transmits an radio frequency reception signal of the band B in a selective manner is arranged, based on an assumption that frequency division duplex (FDD) method is used, the switch 11B is not necessarily arranged in a stage preceding the duplexer. The same applies to the bands A1/A2 and C.

Furthermore, in the case of the time division duplex (TDD) method, the switches 11A, 11B, and 11C are not necessarily arranged between the antenna element 1 and the acoustic wave filter 10A and the filters 20B and 20C, respectively. The switches 11A, 11B, and 11C may be arranged between the power amplifier 24 and the acoustic wave filter 10A and the filters 20B and 20C, respectively, or switches may be arranged in stages preceding and following the acoustic wave filter 10A and the filters 20B and 20C, respectively.

With the configuration described above, the RF front end circuit 2 functions as an RF front end circuit for radio communication that is able to select at least one of the bands A1/A2, B, and C in accordance with the control signals C1 and C2 from the RFIC 3 and transmit an RF signal through the selected signal path at low loss.

[1.2 Configuration of Acoustic Wave Filter Device]

In a system supporting multiple modes/multiple bands, two or more bands whose frequency bands are adjacent to each other or partially overlap may be exclusively used in a selective manner. In the RF front end circuit 2 illustrated in FIG. 1, the band A1 and the band A2 correspond to this case. The relationship of the band A1 and the band A2 and the required transmission characteristics will be explained below.

Figure 2:
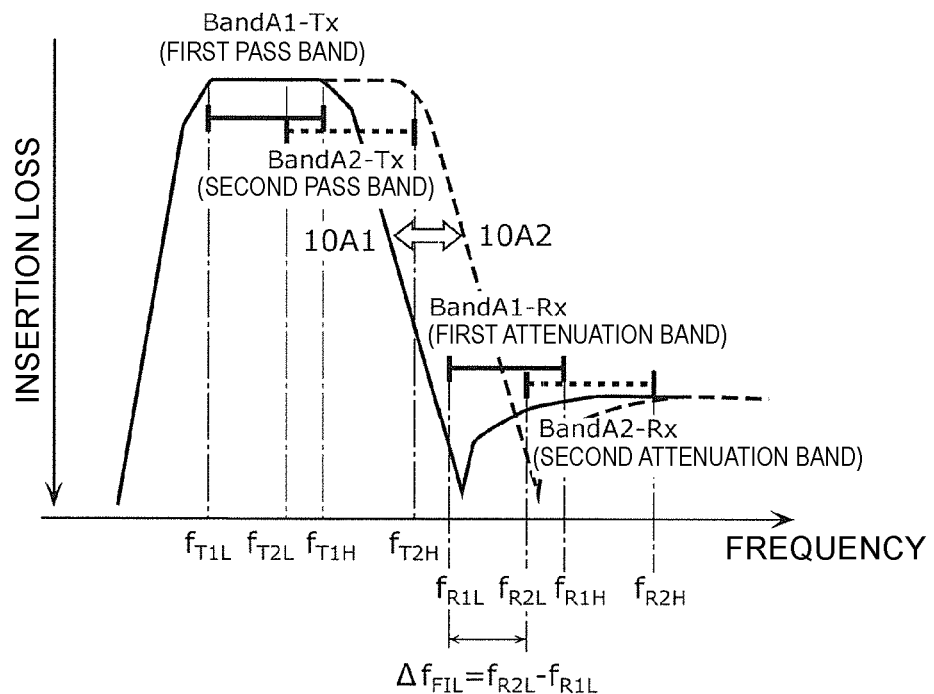
FIG. 2 is a diagram for explaining the relationship of transmission characteristics and frequency allocation of an acoustic wave filter according to the first embodiment.

FIG. 2 is a diagram for explaining the relationship of the transmission characteristics and frequency allocation of the acoustic wave filter 10A according to the first embodiment. As illustrated in FIG. 2, a transmission band (first pass band) of the band A1 ranges from $f_{T1L}$ to $f_{T1H}$, and a transmission band (second pass band) of the band A2 ranges from $f_{T2L}$ to $f_{T2H}$. The transmission band of the band A1 and the transmission band of the band A2 overlap in the range from $f_{T2L}$ to $f_{T1H}$. Furthermore, a radio frequency end $f_{T2H}$ of the transmission band of the band A2 is higher than a radio frequency end $f_{T1H}$ of the transmission band of the band A1. In contrast, a reception band (first attenuation band) of the band A1 ranges from $f_{R1L}$ to $f_{R1H}$, and a reception band (second attenuation band) of the band A2 ranges from $f_{R2L}$ to $f_{R2H}$. The reception band of the band A1 and the reception band of the band A2 overlap in the range from $f_{R2L}$ to $f_{R1H}$. Furthermore, the frequency interval between the radio frequency end $f_{T2H}$ of the transmission band of the band A2 and the low frequency end $f_{R1L}$ of the reception band of the band A1 is very small or the radio frequency end $f_{T2H}$ and the low frequency end $f_{R1L}$ overlap. In the frequency allocation mentioned above, the band A1 and the band A2 are exclusively used in a selective manner.

In the case where a transmission-side filter is configured based on frequency specifications of the band A1 and the band A2 described above, the transmission characteristics illustrated in FIG. 2 are required to ensure low-loss characteristics of each transmission band and an attenuation amount in each reception band. That is, the characteristics represented by the solid line in FIG. 2 are required as filter characteristics 10A1 (first filter characteristics) of the transmission-side filter of the band A1, and the characteristics represented by the broken line in FIG. 2 are required as filter characteristics 10A2 (second filter characteristics) of the transmission-side filter of the band A2. Specifically, a higher frequency side of the in-band transmission characteristics of the transmission-side filter of the band A1 is shifted toward lower frequencies to decrease the band width, compared to the in-band transmission characteristics of the transmission-side filter of the band A2. In other words, the radio frequency end of the second pass band needs to be shifted toward lower frequencies to the radio frequency end of the first pass band, and an attenuation pole in the vicinity of the higher frequency side of the second pass band needs to be shifted toward lower frequencies to the attenuation pole in the vicinity of the higher frequency side of the first pass band.

In the acoustic wave filter 10A according to this embodiment, a frequency difference between the frequency of the attenuation pole of the second filter characteristics and the frequency of the attenuation pole of the first filter characteristics is equal to or more than a frequency difference $\Delta f_{FIL}$ between a low frequency end frequency $f_{R2L}$ in the second attenuation band and a low frequency end frequency $f_{R1L}$ in the first attenuation band. This frequency relationship will be explained in detail with reference to FIGS. 7 to 13B.

In terms of the filter requirement characteristics mentioned above, the acoustic wave filter 10A according to this embodiment is implemented with a simple and compact configuration by switching between the filter characteristics 10A1 required for the band A1 and the filter characteristics 10A2 required for the band A2.

The state in which, for two bands, "frequency bands are adjacent to each other or partially overlap" is not limited to a case where pass bands partially overlap, as with the band A1 and the band A2 illustrated in FIG. 2. Even if two bands are away from each other, for example, a case with a frequency relationship in which the frequency interval between the two bands is within several percent of the center frequency of the two band (the average frequency of center frequencies) is also included.

Figure 3:
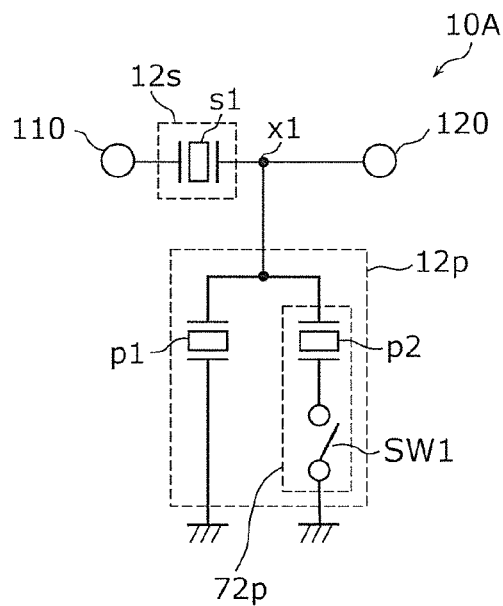
FIG. 3 is a circuit configuration diagram illustrating an example of the acoustic wave filter according to the first embodiment.

FIG. 3 is a circuit configuration diagram of the acoustic wave filter 10A according to the first embodiment. The acoustic wave filter 10A illustrated in FIG. 3 includes a series-arm circuit 12s, a parallel-arm resonant circuit 12p, and input/output terminals 110 and 120.

The series-arm circuit 12s is connected between the input/output terminal 110 (first input/output terminal) and the input/output terminal 120 (second input/output terminal). The series-arm circuit 12s according to this embodiment includes a series-arm resonator s1 connected between the input/output terminals 110 and 120.

The parallel-arm resonant circuit 12p is connected to a node x1 on a path connecting the input/output terminal 110 to the input/output terminal 120 and the ground. The parallel-arm resonant circuit 12p includes a parallel-arm resonator p1 and a frequency variable circuit 72p. The parallel-arm resonator p1 is a first acoustic wave resonator connected between the node x1 and the ground.

The frequency variable circuit 72p is connected in parallel with the parallel-arm resonator p1 and has a function for varying a resonant frequency and an anti-resonant frequency of the parallel-arm resonant circuit 12p. The frequency variable circuit 72p includes a parallel-arm resonator p2 and a switch SW1. The parallel-arm resonator p2 is a second acoustic wave resonator whose resonant frequency is higher than the resonant frequency of the parallel-arm resonator p1 and whose anti-resonant frequency is higher than the anti-resonant frequency of the parallel-arm resonator p1. The switch SW1 is a switch element that is arranged between the node x1 and the ground and connected in series with the parallel-arm resonator p2.

With the above configuration, the filter characteristics 10A1 illustrated in FIG. 2 are achieved in the case where the switch SW1 is in a conduction state, and the filter characteristics 10A2 illustrated in FIG. 2 are achieved in the case where the switch SW1 is in a non-conduction state.

The resonant frequency of the parallel-arm resonator p2 is higher than the resonant frequency of the parallel-arm resonator p1. Furthermore, the resonant frequency of the parallel-arm resonator p2 is higher than the resonant frequency of the series-arm resonator s1 and lower than the anti-resonant frequency of the series-arm resonator s1.

That is, in the acoustic wave filter 10A according to this embodiment, the parallel-arm resonator p1, out of the series-arm resonator s1 and the parallel-arm resonator p1 that configure a ladder filter, and a circuit in which the parallel-arm resonator p2 and the switch SW1 for frequency variation are connected in series, are connected in parallel between the node x1 and the ground.

Furthermore, the switch SW1 may be, for example, a GaAs or CMOS (Complementary Metal Oxide Semiconductor) FET (Field Effect Transistor) switch or a diode switch. Accordingly, an FET switch or diode switch configures the switch SW1. Thus, the acoustic wave filter 10A with a compact size may be achieved.

In this embodiment, each of the series-arm resonator s1 and the parallel-arm resonators p1 and p2 is a resonator using surface acoustic waves. Accordingly, IDT (InterDigital Transducer) electrodes formed on a substrate having piezoelectric characteristics may configure the acoustic wave filter 10A. Thus, the acoustic wave filter 10A with a compact size and low profile having transmission characteristics with high steepness may be achieved. A structure of a surface acoustic wave resonator will be explained below.

Figure 4:
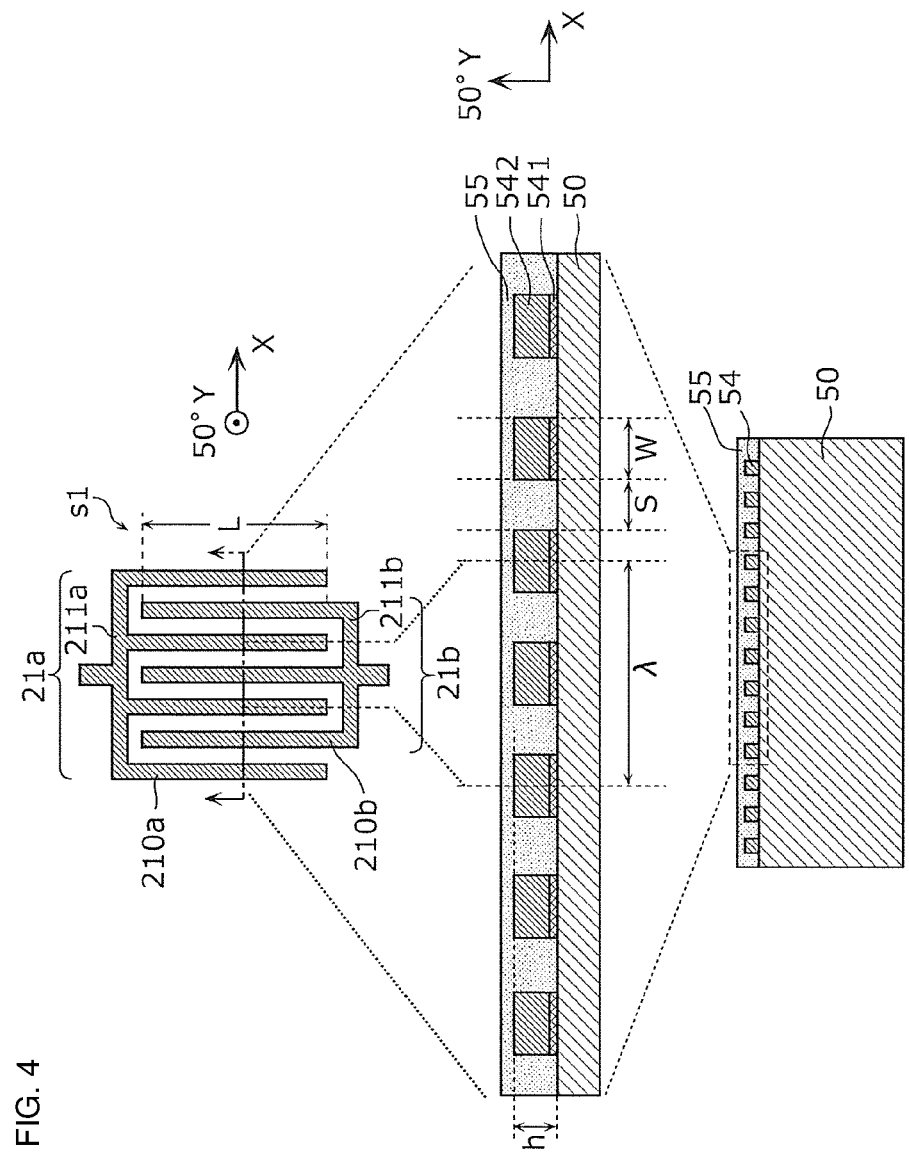
FIG. 4 is an example of a plan view and a cross-sectional view schematically illustrating a resonator of the acoustic wave filter according to the first embodiment.

FIG. 4 is an example of a plan view and a cross-sectional view schematically illustrating a resonator of the acoustic wave filter 10A according to the first embodiment. In FIG. 4, a schematic plan view and a schematic cross-sectional view illustrating a structure of the series-arm resonator s1, out of the series-arm resonator s1 and the parallel-arm resonators p1 and p2 configuring the acoustic wave filter 10A, are illustrated. The series-arm resonator in FIG. 4 is illustrated for explaining a typical structure of the plurality of resonators. The number, length, and the like of electrode fingers configuring an electrode are not limited to those illustrated in FIG. 4.

Each resonator of the acoustic wave filter 10A includes a piezoelectric substrate 50 and IDT electrodes 21a and 21b having a comb-like shape.

As illustrated in the plan view of FIG. 4, the pair of IDT electrodes 21a and 21b that face each other are formed on the piezoelectric substrate 50. The IDT electrode 21a includes a plurality of electrode fingers 210a that are parallel to one another and a busbar electrode 211a that connects the plurality of electrode fingers 210a together. Furthermore, the IDT electrode 21b includes a plurality of electrode fingers 210b that are parallel to one another and a busbar electrode 211b that connects the plurality of electrode fingers 210b together. The plurality of electrode fingers 210a and 210b are formed along a direction orthogonal to an X-axis direction.

Furthermore, an IDT electrode 54 that includes the plurality of electrode fingers 210a and 210b and the busbar electrodes 211a and 211b has a multilayer structure including a close contact layer 541 and a main electrode layer 542, as indicated in the cross-sectional view of FIG. 4.

The close contact layer 541 is a layer for improving the close-contact characteristics between the piezoelectric substrate 50 and the main electrode layer 542, and is made of, for example, Ti. The film thickness of the close contact layer 541 is, for example, 12 nm.

For example, Al containing 1% of Cu is used as a material for the main electrode layer 542. The film thickness of the main electrode layer 542 is, for example, 162 nm.

A protection layer 55 is formed to cover the IDT electrodes 21a and 21b. The protection layer 55 is a layer with a purpose of protecting the main electrode layer 542 from external environment, adjusting frequency-temperature characteristics, increasing moisture resistance, and the like, and contains, for example, silicon dioxide as a main component.

The structure of each resonator included in the acoustic wave filter 10A according to the present disclosure is not limited to the structure illustrated in FIG. 4. For example, the IDT electrode 54 may not have a multilayer structure including metal films but have a single-layer structure of a metal film.

Furthermore, materials forming the close contact layer 541, the main electrode layer 542, and the protection layer 55 are not limited to the materials mentioned above. Furthermore, the IDT electrode 54 may not have the multilayer structure described above. The IDT electrode 54 may be made of a metal such as, for example, Ti, Al, Cu, Pt, Au, Ag, Pd, or NiCr or an alloy of these metals or may have a plurality of multilayer bodies each including the metal mentioned above or an alloy of these metals. Furthermore, the protection layer 55 may not be formed.

The piezoelectric substrate 50 includes, for example, 50° Y-cut, X-propagation $LiTaO_3$ piezoelectric monocrystal or piezoelectric ceramics (lithium tantalate monocrystal or ceramics which is cut along a plane whose normal is defined by an axis that is rotated around an X axis as a central axis by 50 degrees from a Y axis and through which surface acoustic waves propagate in the X-axis direction). In this embodiment, 50° Y-cut, X-propagation $LiTaO_3$ piezoelectric monocrystal is exemplified as the piezoelectric substrate 50. However, a monocrystal material forming the piezoelectric substrate 50 is not limited to $LiTaO_3$, and cut-angles of the monocrystal material are not limited to that mentioned above.

Now, design parameters for an IDT electrode will be explained. The wave length λ of a surface acoustic wave resonator is defined as being twice the pitch of the plurality of electrode fingers 210a and 210b configuring the IDT electrodes 21a and 21b illustrated in the middle part of FIG. 4. Furthermore, the cross width L of IDT electrodes represents the length of the electrode fingers 210a of the IDT electrode 21a and the electrode fingers 210b of the IDT electrode 21b that overlap when viewed from the X-axis direction, as illustrated in the upper part of FIG. 4. Furthermore, the number of pairs is represented by (Mp−1)/2, where Mp represents the total number of the electrode fingers 210a and 210b. Furthermore, an electrode duty (duty ratio) represents a line width occupancy rate of a plurality of electrode fingers and the ratio of a line width of the plurality of electrode fingers to the sum of the line width and space width of the plurality of electrode fingers. The electrode duty is defined as Ws1/(Ws1+Ss1), where half the wave length λ is represented by Ps1, the line width of the electrode fingers is represented by Ws1, and the space between adjacent electrode fingers is represented by Ss1. That is, the electrode duty is defined by the ratio of the width of the plurality of electrode fingers to the electrode finger pitch (pitch of the plurality of electrode fingers), that is, Ws1/Ps1. In accordance with requirements specification of pass bands of the band A1 and the band A2, the wave length λ, the cross width L, the number of pairs, and the electrode duty of the series-arm resonator s1 and the parallel-arm resonators p1 and p2 are set.

In terms of miniaturization of the acoustic wave filter 10A, it is desirable that the series-arm resonator s1 and the parallel-arm resonators p1 and p2 be formed on the same piezoelectric substrate 50. However, the series-arm resonator s1 and the parallel-arm resonators p1 and p2 may be formed on different substrates.

Furthermore, the series-arm resonator s1 and the parallel-arm resonators p1 and p2 may not be surface acoustic wave resonators but may be resonators using BAWs (Bulk Acoustic Waves). Accordingly, piezoelectric elements using acoustic waves may configure the acoustic wave filter 10A. Thus, a compact filter circuit having transmission characteristics with high steepness can be achieved.

[1.3 Basic Transmission Characteristics of Acoustic Wave Filter Device]

Figure 5:
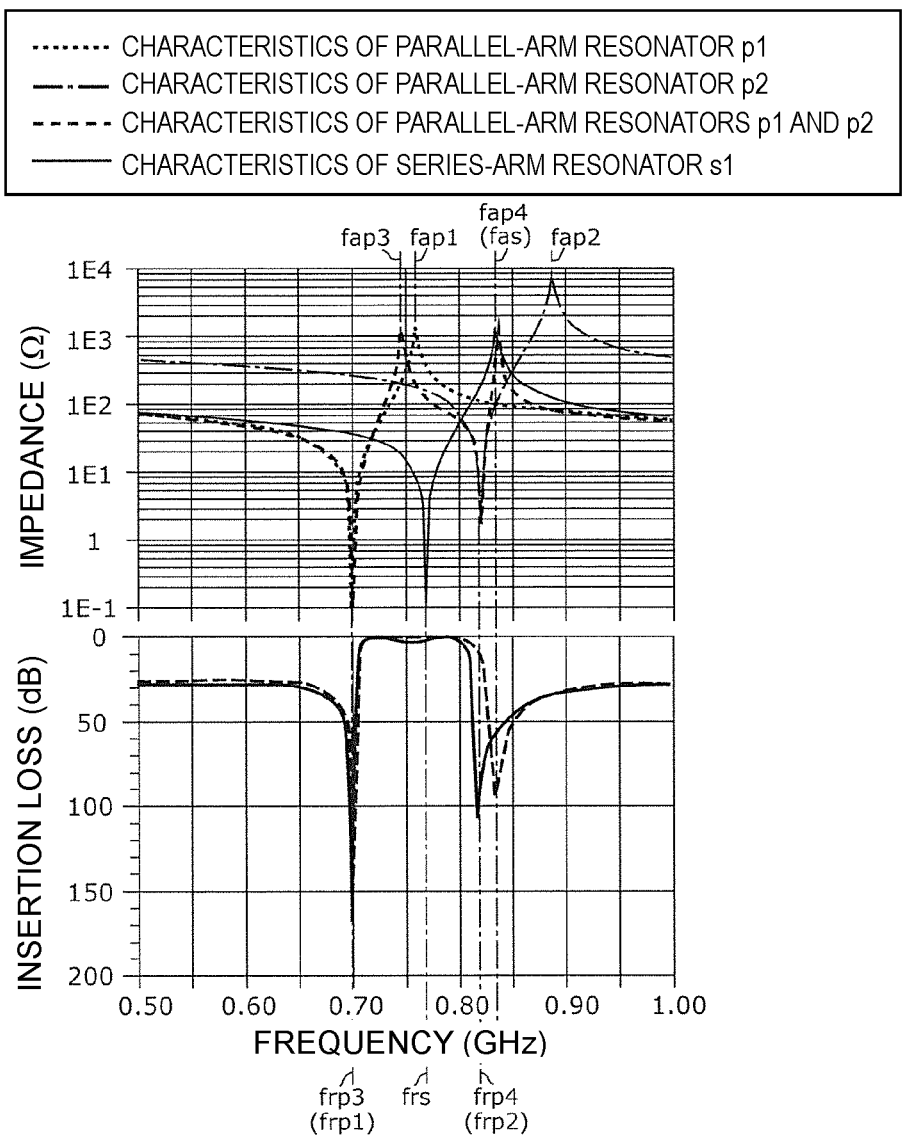
FIG. 5 is a graph indicating comparison between impedance characteristics and transmission characteristics at the time of conduction of a switch of the acoustic wave filter according to the first embodiment and impedance characteristics and transmission characteristics at the time of non-conduction of the switch.

Basic impedance characteristics and transmission characteristics at the time of non-conduction (hereinafter, described as OFF) of the switch SW1 of the acoustic wave filter 10A and conduction (hereinafter, described as ON) of the switch SW1 will be explained with reference to FIG. 5. The basic impedance characteristics and transmission characteristics described above represent impedance characteristics and transmission characteristics in the case where it is assumed that the impedance of the switch SW1 is infinite and the capacitance is 0 when the switch SW1 is in the OFF state.

When the switch SW1 is OFF, the impedance of the series circuit including the parallel-arm resonator p2 and the switch SW1 is infinite, and therefore, the combined impedance characteristics of the impedance characteristics of the series-arm resonator s1 (the solid line in an upper graph of FIG. 5) and impedance characteristics of the parallel-arm resonator p1 (a thin broken line in the upper graph of FIG. 5) are obtained as the impedance characteristics of the acoustic wave filter 10A. Thus, the acoustic wave filter 10A in the case where the switch SW1 is OFF serves as a band pass filter (the broken line in a lower graph of FIG. 5) in which a resonant frequency frp1 of the parallel-arm resonator p1 serves as an attenuation pole on a lower frequency side, an anti-resonant frequency fas of the series-arm resonator s1 serves as an attenuation pole on a higher frequency side, and an anti-resonant frequency fap1 of the parallel-arm resonator p1 and a resonant frequency frs of the series-arm resonator s1 configure a pass band.

In contrast, when the switch SW1 is ON, the combined impedance characteristics of the impedance characteristics of the series-arm resonator s1 (the solid line in the upper graph of FIG. 5) and the impedance characteristics of the parallel resonant circuit including the parallel-arm resonators p1 and p2 that are connected in parallel (a thick broken line in the upper graph of FIG. 5) are obtained as the impedance characteristics of the acoustic wave filter 10A. The combined characteristics of the impedance characteristics of the parallel-arm resonator p1 (the thin broken line in the upper graph of FIG. 5) and the impedance characteristics of the parallel-arm resonator p2 (a one-dotted chain line in the upper graph of FIG. 5) are obtained as the impedance characteristics of the parallel resonant circuit (the thick broken line in the upper graph of FIG. 5). Thus, the acoustic wave filter 10A in the case where the switch SW1 is ON serves as a band pass filter (the solid line in the lower graph of FIG. 5) in which a resonant frequency frp3 (reflecting the resonant frequency frp1 of the parallel-arm resonator p1) of the parallel resonant circuit serves as an attenuation pole on a lower frequency side and a resonant frequency frp4 of the parallel resonant circuit (reflecting the resonant frequency frp2 of the parallel-arm resonator p2) serves as an attenuation pole on a higher frequency side.

When the switch SW1 is ON, the resonant frequency frp2 of the parallel-arm resonator p2 is present on a higher frequency side than the resonant frequency frp1 of the parallel-arm resonator p1. Therefore, an anti-resonant frequency fap3 of the parallel resonant circuit is shifted to a lower frequency side than the anti-resonant frequency fap1 of the parallel-arm resonator p1 and an anti-resonant frequency fap4 of the parallel resonant circuit is shifted to a lower frequency side than the anti-resonant frequency fap2 of the parallel-arm resonator p2. That is, the anti-resonant frequency fap3 of the parallel resonant circuit is located on a lower frequency side than the anti-resonant frequency fap1 of the parallel-arm resonator p1 and the resonant frequency frp4 of the parallel resonant circuit is located on a lower frequency side than the anti-resonant frequency fas of the series-arm resonator s1. Thus, compared to the time at which the switch SW1 is OFF, the pass band width in the case where the switch SW1 is ON is decreased toward lower frequencies, and the attenuation band is shifted toward lower frequencies.

That is, with the configuration mentioned above, the resonant frequency frp2 of the parallel-arm resonator p2 is higher than the resonant frequency frs of the series-arm resonator s1 that affects insertion loss near the center frequency in the pass band and lower than the anti-resonant frequency fas of the series-arm resonator s1 corresponding to the attenuation pole on the higher frequency side outside the pass band. Accordingly, when the switch SW1 is ON, the attenuation pole on the higher frequency side outside the pass band can be shifted toward lower frequencies while low-loss characteristics in the pass band is maintained. Therefore, when the switch SW1 is ON, a radio frequency end of the pass band can be shifted toward lower frequencies. Thus, the pass band width may be decreased without the steepness of the radio frequency end of the pass band being degraded.

An acoustic wave filter according to the present disclosure is not limited to a feature that the resonant frequency frp2 of the parallel-arm resonator p2 is higher than the resonant frequency frs of the series-arm resonator s1 and lower than the anti-resonant frequency fas of the series-arm resonator s1. That is, the resonant frequency frp2 of the parallel-arm resonator p2 may be higher than the anti-resonant frequency fas of the series-arm resonator s1. Even in this case, as described above, by setting the resonant frequency frp2 of the parallel-arm resonator p2 to be higher than the resonant frequency frp1 of the parallel-arm resonator p1, the impedance at the radio frequency end of the pass band of the parallel resonant circuit becomes lower than the impedance at the radio frequency end of the pass band of the parallel-arm resonator p1. Thus, the band width of the acoustic wave filter 10A when the switch SW1 is ON may be smaller than the band width of the acoustic wave filter 10A when the switch SW1 is OFF.

[1.4 Comparison with Related Art]

Now, a comparison between the acoustic wave filter 10A according to this embodiment and a known filter circuit will be performed.

Figure 6:
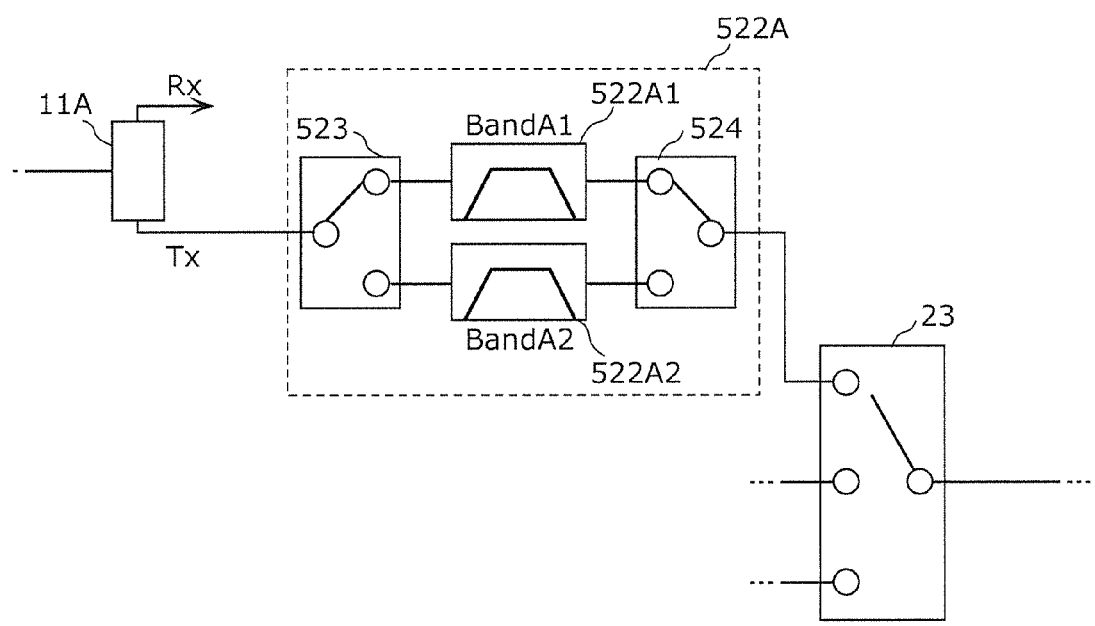
FIG. 6 is a circuit configuration diagram of an acoustic wave filter according to a comparative example.

FIG. 6 is a circuit configuration diagram of a filter circuit 522A according to a comparative example. The filter circuit 522A illustrated in FIG. 6 is a known filter circuit and includes a transmission-side filter 522A1 for the band A1, a transmission-side filter 522A2 for the band A2, and switches 523 and 524 of an SPDT type. The filter circuit 522A is similar to the acoustic wave filter 10A according to this embodiment in that the switch 23 is connected to a stage preceding the filter circuit 522A and the switch 11A is connected to a stage following the filter circuit 522A. As illustrated in FIG. 6, in the filter circuit 522A according to the comparative example, a circuit for exclusively selecting two frequency bands, the band A1 and the band A2 that are adjacent to each other, requires two independent filters and two switches of the SPDT type. To configure a switch of the SPDT type, for example, four FET switches are required. That is, in the circuit configuration of the filter circuit 522A according to the comparative example, two independent filters and eight FET switches are required. Thus, the circuit configuration is complicated, and the circuit size increases.

In contrast, the acoustic wave filter 10A according to this embodiment is configured of a filter circuit including the series-arm circuit 12s and the parallel-arm resonators p1 and p2 and the switch SW1 of the SPST type, as illustrated in FIG. 3. Thus, the filter circuit may be simplified and miniaturized.

[1.5 Circuit Configuration with Off Capacitance of Acoustic Wave Filter Device Taken into Consideration]

Figure 7:
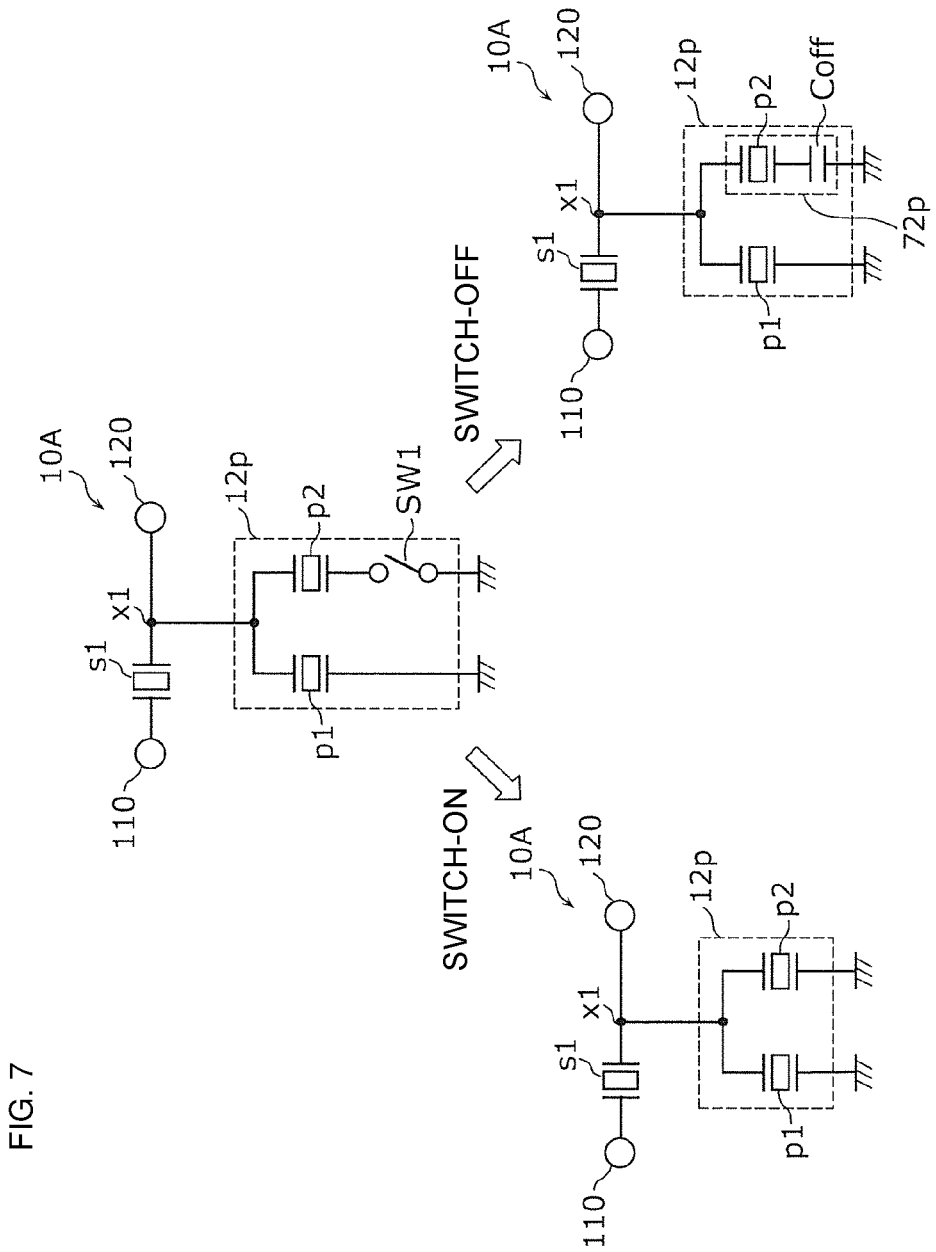
FIG. 7 is a diagram illustrating a circuit state at the time of conduction of a switch of the acoustic wave filter according to the first embodiment and a circuit state at the time of non-conduction of the switch.

FIG. 7 is a diagram illustrating a circuit state in the case where the acoustic wave filter 10A according to the first embodiment is switched ON and switched OFF. In the case where the switch SW1 is the ON state, the parallel-arm resonant circuit 12p serves as a circuit in which the parallel-arm resonators p1 and p2 are connected in parallel, and an equivalent circuit of the acoustic wave filter 10A is represented by a circuit illustrated on a lower left side of FIG. 7. In contrast, in the case where the switch SW1 is in the OFF state, the impedance of the switch SW1 is ideally infinite. In actuality, however, the impedance of the switch SW1 is not infinite, and the parallel-arm resonant circuit 12p has an off capacitance ($C_{off}$), which is a capacitance component at the time when the switch SW1 is OFF. Thus, the equivalent circuit of the acoustic wave filter 10A is represented by a circuit illustrated on the lower right side of FIG. 7.

Figure 8:
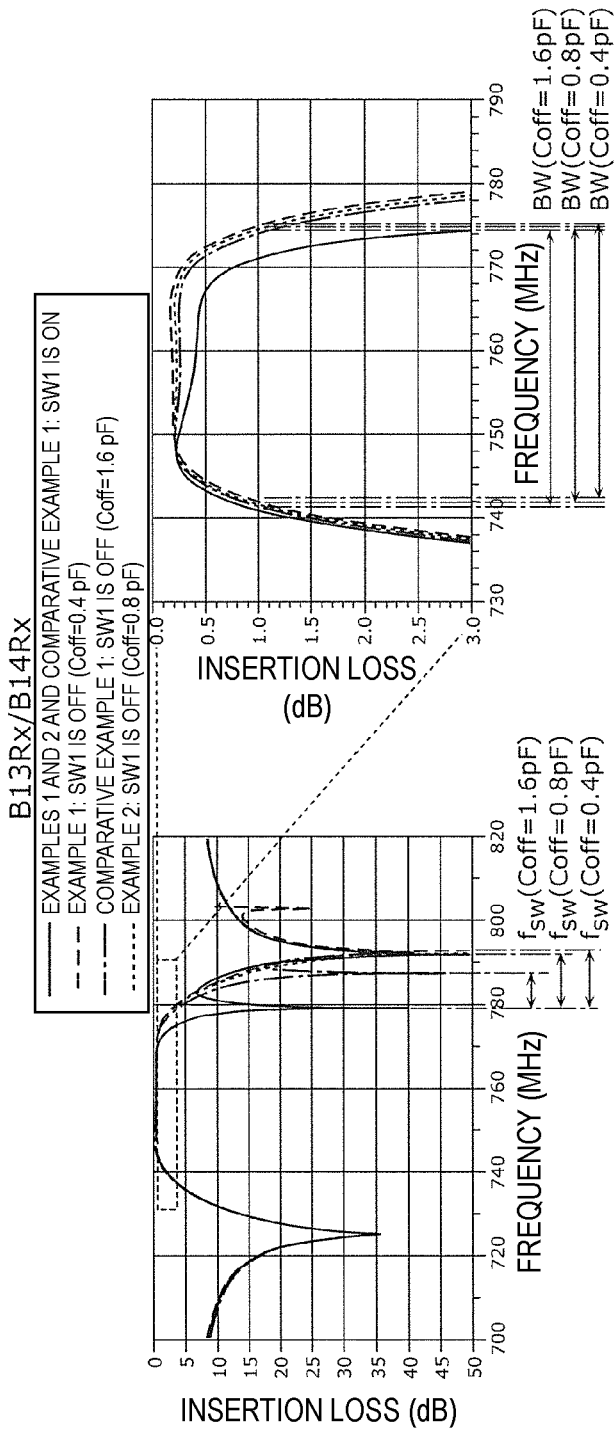
FIG. 8 is a graph indicating comparison of transmission characteristics in the case where an off capacitance of the acoustic wave filter according to the first embodiment is varied.
Figure 9:
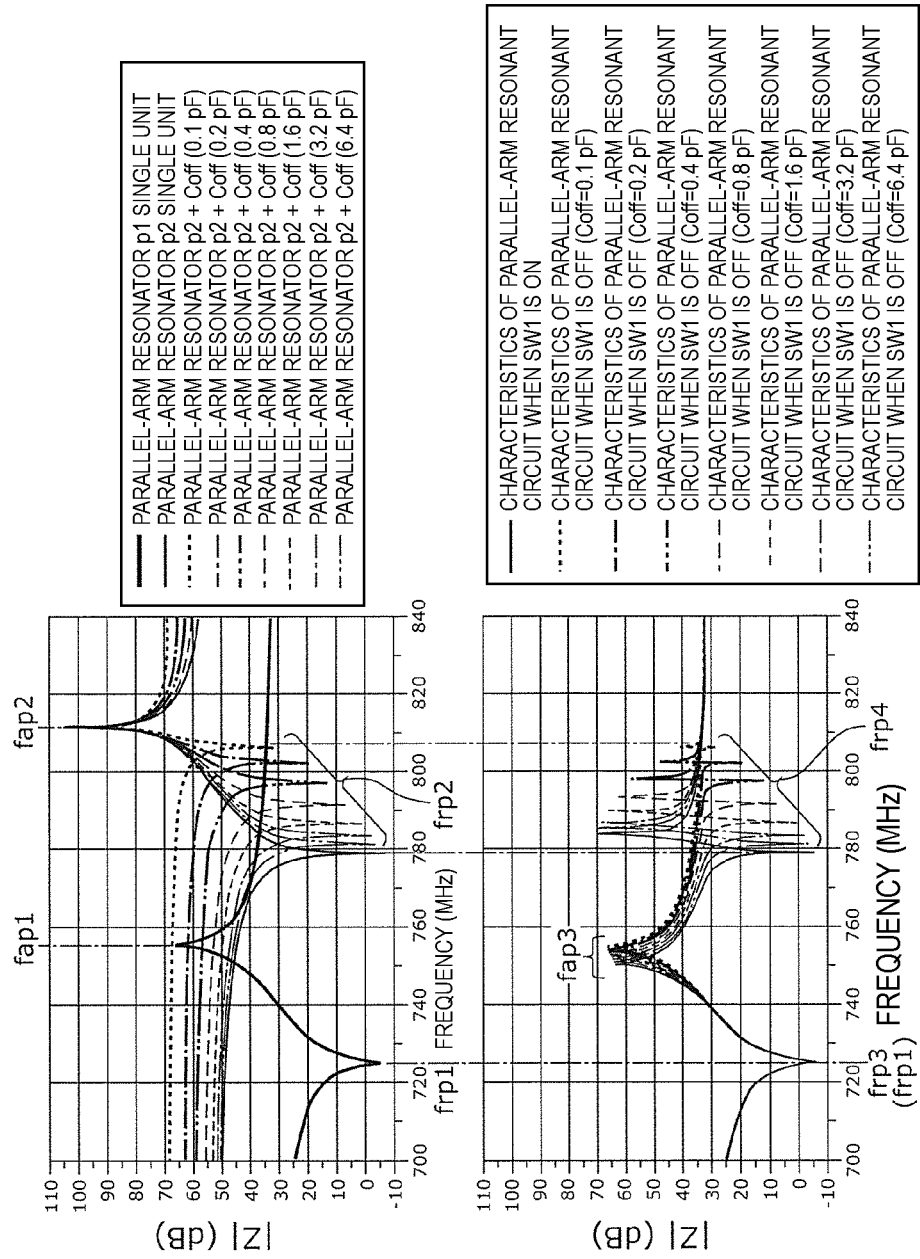
FIG. 9 is a graph indicating comparison of impedance characteristics in the case where an off capacitance of a parallel-arm resonant circuit according to the first embodiment is varied.
Figure 10:
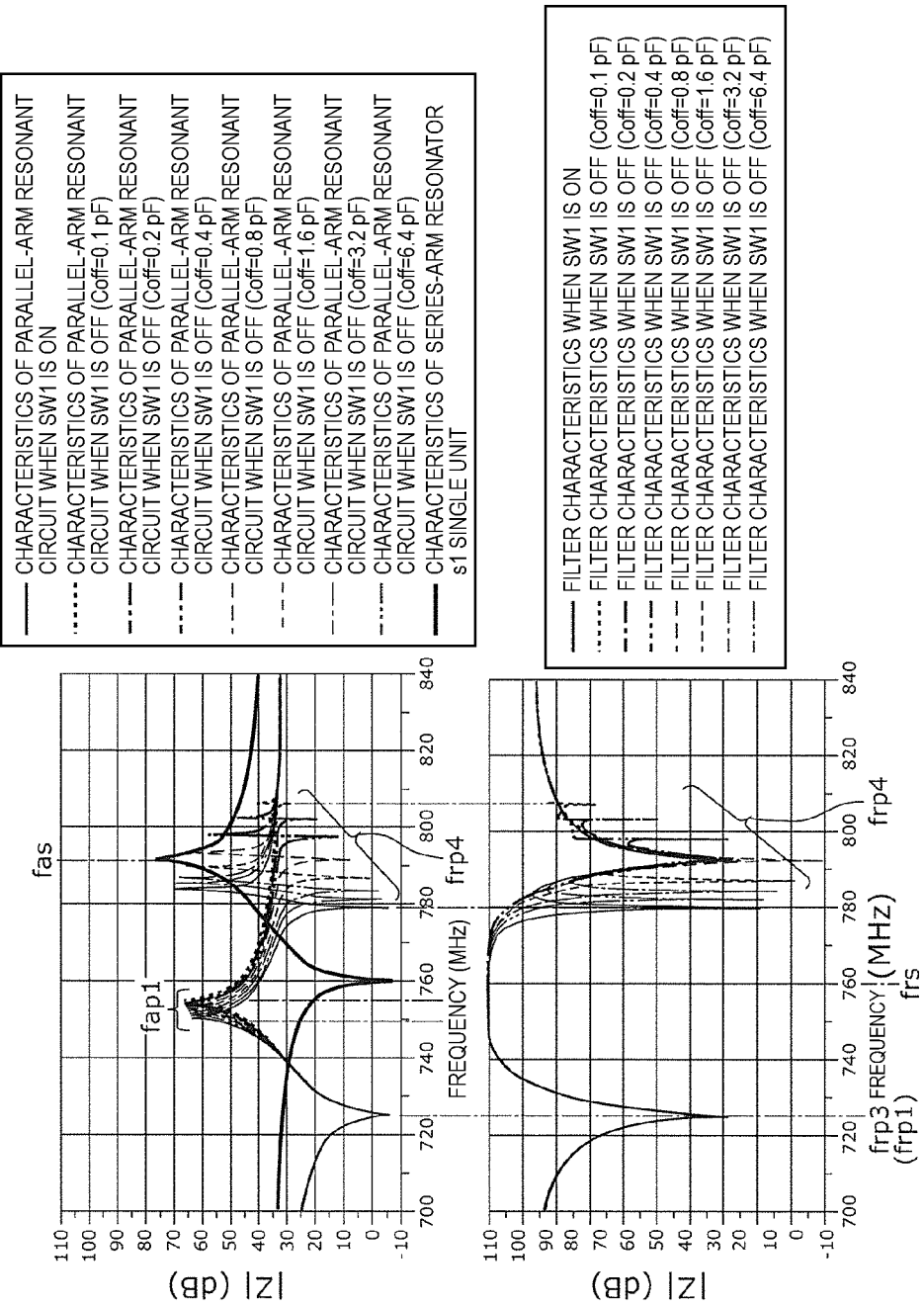
FIG. 10 is a graph indicating impedance characteristics and transmission characteristics in the case where the off capacitance of the acoustic wave filter according to the first embodiment is varied.
Figure 11A:
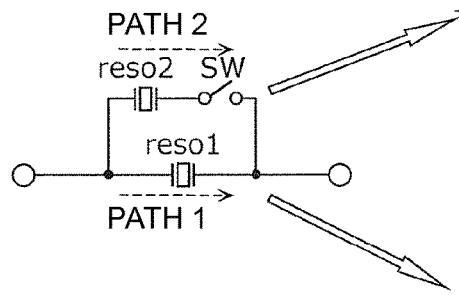
Figure 11A:
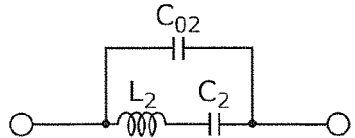
Figure 11A:
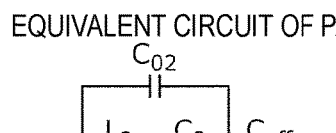
Figure 11A:
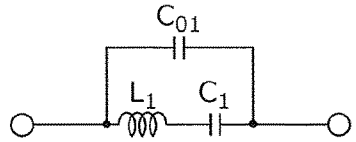
Figure 11A:
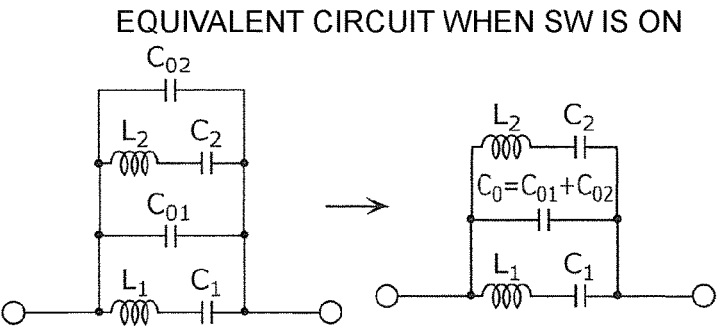
Figure 11A:
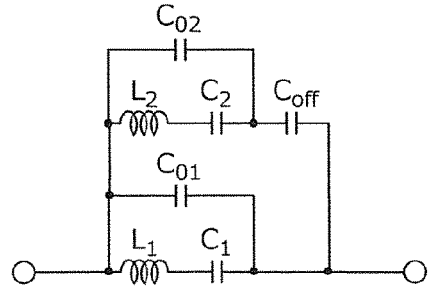

FIG. 8 is a graph indicating comparison of transmission characteristics in the case where the off capacitance of the acoustic wave filter 10A according to the first embodiment is varied. Furthermore, FIG. 9 is a graph indicating comparison of impedance characteristics in the case where the capacitance value of the off capacitance $C_{off}$ of the parallel-arm resonant circuit 12p in the first embodiment is varied. Furthermore, FIG. 10 is a graph indicating impedance characteristics and transmission characteristics in the case where the capacitance value of the off capacitance $C_{off}$ of the acoustic wave filter 10A according to the first embodiment is varied.

In FIGS. 7 to 10, the acoustic wave filter 10A that switches between Band 13 and Band 14 based on LTE standards is illustrated. Table 1 illustrates specifications and parameters of acoustic wave filters according to Example 1, Example 2, and Comparative Example 1.

TABLE 1

| | |
|---|---|
| First pass band | Band 13 reception band (746-756 MHz) |
| First attenuation band | Band 13 transmission band (777-787 MHz) |
| Second pass band | Band 14 reception band (758-768 MHz) |
| Second attenuation band | Band 14 transmission band (788-798 MHz) |

| | Resonant frequency (MHz) | Anti-resonant frequency (MHz) | Electrostatic capacitance (pF) |
|---|---|---|---|
| Series-arm resonator s1 | 760 | 792 | 3.0 |
| Parallel-arm resonator p1 | 725 | 755 | 6.0 |
| Parallel-arm resonator p2 | 779 | 812 | 0.5 |
| Off capacitance $C_{off}$ in Example 1 (pF) | | 0.4 | |
| Off capacitance $C_{off}$ in Example 2 (pF) | | 0.8 | |
| Off capacitance $C_{off}$ in Comparative Example 1 (pF) | | 1.6 | |

The electrostatic capacitance of the acoustic wave resonator illustrated in Table 1 is expressed by Expression 1.

[Math. 2]

$$\text{Electrostatic capacitance} = \frac{\varepsilon_0 \cdot \varepsilon_r \cdot \text{number of pairs} \cdot \text{cross width}}{2 \cdot (1 - \text{electrode duty})} \quad \text{(Expression 1)}$$

In Expression 1, $\varepsilon_0$ represents permittivity in vacuum, and $\varepsilon r$ represents permittivity of the piezoelectric substrate 50.

In the upper part of FIG. 9, the impedance characteristics of the parallel-arm resonator p1 single unit, the impedance characteristics of the parallel-arm resonator p2 single unit, and the impedance characteristics of the frequency variable circuit at the time when the switch SW1 is OFF in the case where the off capacitance $C_{off}$ is varied within a range from 0.1 pF to 6.4 pF are illustrated. In the lower part of FIG. 9, the impedance characteristics of the parallel-arm resonant circuit at the time when the switch SW1 is ON and the impedance characteristics of the parallel-arm resonant circuit at the time when the switch SW1 is OFF in the case where the off capacitance $C_{off}$ is varied within a range from 0.1 pF to 6.4 pF are illustrated.

Furthermore, in the upper part of FIG. 10, in addition to the graph in the lower part of FIG. 9, the impedance characteristics of the series-arm resonator s1 single unit are illustrated. Furthermore, in the lower part of FIG. 10, the filter characteristics of the acoustic wave filter at the time when the switch SW1 is ON and the filter characteristics of the acoustic wave filter at the time when the switch SW1 is OFF in the case where the off capacitance $C_{off}$ is varied within a range from 0.1 pF to 6.4 pF are illustrated.

As illustrated in FIG. 10, an attenuation pole on a lower frequency side of the pass band is defined by the resonant frequency frp3 on a lower frequency side of the parallel-arm resonant circuit. Furthermore, a pass band is defined by the resonant frequency frs of the series-arm resonator s1 and the anti-resonant frequency fap1 on the lower frequency side of the parallel-arm resonant circuit. Furthermore, the anti-resonant frequency fas of the series-arm resonator s1 and the resonant frequency frp4 on a higher frequency side of the parallel-arm resonant circuit define two attenuation poles on the higher frequency side of the pass band.

Ideally, when the switch SW1 is OFF, it is desirable that the impedance of the switch SW1 be infinite. In actuality, however, an increase in the off capacitance $C_{off}$ causes the impedance to be decreased. Thus, as illustrated in FIG. 9, the resonant frequency (frp2) of the frequency variable circuit at the time when the switch SW1 is OFF (combined characteristics of the parallel-arm resonator p2 and the off capacitance $C_{off}$) and the resonant frequency frp4, out of the two resonant frequencies frp3 and frp4 of the parallel-arm resonant circuit at the time when the switch SW1 is OFF, vary according to the value of the off capacitance $C_{off}$, and the attenuation poles on the higher frequency side of the pass band thus vary, as illustrated in FIG. 9.

As illustrated in the upper graph of FIG. 9, when the off capacitance $C_{off}$ increases, the resonant frequency (frp2) of the frequency variable circuit at the time when the switch SW1 is OFF (combined characteristics of the parallel-arm resonator p2 and the off capacitance $C_{off}$) is shifted toward lower frequencies. Thus, as illustrated in the lower graph of FIG. 9 and the upper graph of FIG. 10, by increasing the off capacitance $C_{off}$, the resonant frequency frp4 on the higher frequency side, out of the two resonant frequencies frp3 and frp4 of the parallel-arm resonant circuit at the time when the switch SW1 is OFF, is also shifted toward lower frequencies, and the anti-resonant frequency fap3 on the lower frequency side is also shifted toward lower frequencies. Variations in the off capacitance $C_{off}$ do not affect the anti-resonant frequency (fap2) of the frequency variable circuit (combined characteristics of the parallel-arm resonator p2 and the off capacitance $C_{off}$).

That is, as illustrated in the lower graph of FIG. 10, as the off capacitance $C_{off}$ increases, the attenuation pole (frp4) on the higher frequency side of the pass band at the time when the switch SW1 is OFF is shifted toward lower frequencies. Thus, a frequency difference between the resonant frequency frp4 of the parallel-arm resonant circuit at the time when the switch SW1 is OFF and the resonant frequency frp4 of the parallel-arm resonant circuit at the time when the switch SW1 is ON, that is, the amount of frequency shift (resonant frequency difference) between the attenuation pole (frp4) on the higher frequency side of the pass band at the time when the switch SW1 is OFF and the attenuation pole (frp4) on the higher frequency side of the pass band at the time when the switch SW1 is ON, decreases as the off capacitance $C_{off}$ increases. Moreover, as the off capacitance $C_{off}$ increases, the anti-resonant frequency fap3 on the lower frequency side is also shifted toward lower frequencies. Therefore, the cutoff frequency on the higher frequency side of the pass band at the time when the switch is OFF is shifted toward lower frequencies, and the pass band width at the time when the switch is OFF decreases.

In the left graph of FIG. 8, transmission characteristics and amounts of frequency shift of the acoustic wave filter 10A according to Example 1 ($C_{off}$=0.4 pF), the acoustic wave filter 10A according to Example 2 ($C_{off}$=0.8 pF), and the acoustic wave filter according to Comparative Example 1 ($C_{off}$=1.6 pF) are illustrated. In Example 1 and Example 2 in which the value of the off capacitance $C_{off}$ is small, a large amount of frequency shift ($f_{SW}(C_{off}$=0.4 pF) and $f_{SW}$ ($C_{off}$=0.8 pF) in FIG. 8) can be ensured. In contrast, in Comparative Example 1 in which the value of the off capacitance $C_{off}$ is large, the resonant frequency frp2 of the frequency variable circuit at the time when the switch SW1 is OFF is significantly lower than the anti-resonant frequency fas of the series-arm resonator s1, and the amount of frequency shift ($f_{SW}(C_{off}$=1.6 pF) in FIG. 8) is small.

Furthermore, in Comparative Example 1 and Example 2 in which the off capacitance $C_{off}$ is larger than the electrostatic capacitance of the parallel-arm resonator p2 (0.5 pF), as indicated in the upper graph of FIG. 10, the resonant frequency frp4 (the attenuation pole on the higher frequency side of the pass band) of the parallel-arm resonant circuit at the time when the switch SW1 is OFF is lower than the attenuation pole configured of the anti-resonant frequency fas of the series-arm resonator s1. Moreover, the resonant frequency frp4 of the parallel-arm resonant circuit at the time when the switch SW1 is OFF configuring the pass band at the time when the switch SW1 is OFF is located on a lower frequency side. In this case, as indicated in the right graph of FIG. 8, as the amount of frequency shift decreases, the pass band width at the time when the switch SW1 is OFF decreases. In particular, insertion loss in a radio frequency end of the pass band is degraded.

In the acoustic wave filter 10A according to this example, the amount of frequency shift (resonant frequency difference) is equal to or more than a frequency difference $\Delta f_{FIL}$ (attenuation band frequency difference) between a lower frequency end frequency (788 MHz) of the Band 14 transmission band and a lower frequency end frequency (777 MHz) of the Band 13 transmission band. This frequency relationship will be explained in detail with reference to FIGS. 11A to 13B.

[1.6 Optimization of Off Capacitance of Acoustic Wave Filter Device]

Hereinafter, resonant characteristics of a parallel-arm resonant circuit including an acoustic wave resonator and a switch element will be explained using an equivalent circuit model, and the range of the off capacitance $C_{off}$ will be defined.

Each of FIGS. 11A, 11B, 11C and 11D is a diagram illustrating an equivalent circuit of the parallel-arm resonant circuit 12p in this embodiment. The parallel-arm resonant circuit illustrated in FIG. 11A has the same circuit configuration as that of the parallel-arm resonant circuit 12p according to this embodiment. That is, the parallel-arm resonant circuit illustrated in each of FIGS. 11A, 11B, 11C and 11D includes a resonator reso1, a resonator reso2, and a switch SW. The resonator reso1 (corresponding to the parallel-arm resonator p1) is arranged on a path 1, and the resonator reso2 (corresponding to the parallel-arm resonator p2) and the switch SW (corresponding to the switch SW1) are arranged on a path 2. The resonator reso2 and the switch SW configure a frequency variable circuit, and the frequency variable circuit is connected in parallel with the resonator reso1. The resonator reso2 has a resonant frequency that is higher than the resonant frequency of the resonator reso1 and an anti-resonant frequency that is higher than the anti-resonant frequency of the resonator reso1.

The equivalent circuit of the path 2 at the time when the switch SW is ON is configured of an inductor having an inductance $L_2$, a capacitor having an electrostatic capacitance $C_2$, and a capacitor having an electrostatic capacitance $C_{02}$, as illustrated in FIG. 11B. The inductor having the inductance $L_2$ and the capacitance having the electrostatic capacitance $C_2$ are virtual elements defining the resonant frequency of the resonator reso2, and the electrostatic capacitance $C_{02}$ is an electrostatic capacitance of the resonator reso2.

The electrostatic capacitance $C_{02}$ is expressed by Expression 2.

[Math. 3]

$$\text{Electrostatic capacitance } C_{02} = \frac{\varepsilon_0 \cdot \varepsilon_r \cdot \text{number of pairs} \cdot \text{cross width}}{2 \cdot (1 - \text{electrode duty})} \quad \text{(Expression 2)}$$

In Expression 2, $\varepsilon_0$ represents permittivity in vacuum, and $\varepsilon r$ represents permittivity of a piezoelectric substrate configuring the resonator reso2.

The equivalent circuit of the path 2 at the time when the switch SW is OFF includes, as illustrated in FIG. 11C, the inductor having the inductance $L_2$, the capacitor having the electrostatic capacitance $C_2$, the capacitor having the electrostatic capacitance $C_{02}$, and a capacitor having the off capacitance $C_{off}$ of the switch SW.

The equivalent circuit of the path 1 includes, regardless of whether the switch SW is ON or OFF, as illustrated in FIG. 11D, the inductor having an inductance $L_1$, the capacitor having an electrostatic capacitance $C_1$, and a capacitor having an electrostatic capacitance $C_{01}$. The inductance $L_1$ and the electrostatic capacitance $C_1$ are a virtual inductance and a virtual capacitance of virtual elements defining the resonant frequency of the resonator reso1, and the electrostatic capacitance $C_{01}$ is an electrostatic capacitance of the resonator reso1.

The electrostatic capacitance $C_{01}$ is expressed by Expression 3.

[Math. 4]

$$\text{Electrostatic capacitance } C_{01} = \frac{\varepsilon_0 \cdot \varepsilon_r \cdot \text{number of pairs} \cdot \text{cross width}}{2 \cdot (1 - \text{electrode duty})} \quad \text{(Expression 3)}$$

In Expression 3, $\varepsilon_0$ represents permittivity in vacuum, and $\varepsilon r$ represents permittivity of a piezoelectric substrate configuring the resonator reso1.

FIG. 11E is a diagram illustrating an equivalent circuit at the time when the switch of the parallel-arm resonant circuit is ON. The equivalent circuit of the parallel-arm resonant circuit at the time when the switch is ON includes those illustrated in FIGS. 11B and 11D that are combined in parallel, as illustrated in the left part of FIG. 11E. This equivalent circuit is represented by, as illustrated in the right part of FIG. 11E, a circuit in which the inductor having the inductance $L_1$ and the capacitor having the electrostatic capacitance $C_1$ are connected in series, a circuit in which the inductor having the inductance $L_2$ and the capacitor having the electrostatic capacitance $C_2$ are connected in series, and the capacitor having an electrostatic capacitance $C_0$ (=$C_{01}$+$C_{02}$) are connected in parallel.

FIG. 11F is a diagram illustrating an equivalent circuit at the time when the switch of the parallel-arm resonant circuit is OFF. The equivalent circuit of the parallel-arm resonant circuit at the time when the switch is OFF includes those illustrated in FIGS. 11C and 11D that are combined in parallel, as illustrated in FIG. 11F.

FIG. 12 is a graph indicating impedance characteristics of the resonators and the resonant circuit configuring the parallel-arm resonant circuit.

In the equivalent circuit mentioned above, the resonant frequency fr1 (frp1) of the resonator reso1 is defined by a series circuit including the capacitor ($C_1$) and the inductor ($L_1$) and is expressed by Expression 4.

[Math. 5]

$$f_r1 = \frac{1}{2\pi\sqrt{L_1 C_1}} \quad \text{(Expression 4)}$$

Furthermore, the anti-resonant frequency fa1 (fap1) of the resonator reso1 is a frequency whose admittance Y in the equivalent circuit is 0, and is therefore expressed by Expression 6 by solving Expression 5.

[Math. 6]

$$Y = 0 = \frac{1}{\frac{1}{j\omega_{a1} C_{01}}} + \frac{1}{j\omega_{a1} L_1 + \frac{1}{j\omega_{a1} C_1}} \quad \text{(Expression 5)}$$

[Math. 7]

$$f_a1 = \frac{\sqrt{1 + \frac{C_1}{C_{01}}}}{2\pi\sqrt{L_1 C_1}} = f_r1 \sqrt{1 + \frac{C_1}{C_{01}}} \quad \text{(Expression 6)}$$

Based on Expression 4 and Expression 6, as indicated as the characteristics of the resonator reso1 single unit in the upper graph of FIG. 12, the anti-resonant frequency fa1 appears on a higher frequency side than the resonant frequency fr1.

The electrostatic capacitance $C_1$ is expressed by Expression 6 and Expression 7, and the inductance $L_1$ is expressed by Expression 8 based on Expression 4.

[Math. 8]

$$C_1 = C_{01}\left(\left(\frac{f_a1}{f_r1}\right)^2 - 1\right) \quad \text{(Expression 7)}$$

[Math. 9]

$$L_1 = \frac{\left(\frac{1}{2\pi f_r1}\right)^2}{C_1} \quad \text{(Expression 8)}$$

That is, the electrostatic capacitance $C_1$ is derived from the resonant frequency fr1, the anti-resonant frequency fa1, and the electrostatic capacitance $C_{01}$ of the resonator reso1. Furthermore, the inductance $L_1$ is derived from the resonant frequency fr1 and the electrostatic capacitance $C_1$ of the resonator reso1.

Next, the resonant characteristics of the path 2 at the time when the switch SW is ON is similar to the characteristics of the resonator reso2 single unit, and the resonant frequency frs (frp2) and the anti-resonant frequency fas (fap2) are expressed by Expression 9 and Expression 10.

[Math. 10]

$$f_r2 = \frac{1}{2\pi\sqrt{L_2 C_2}} \quad \text{(Expression 9)}$$

[Math. 11]

$$f_a2 = \frac{\sqrt{1 + \frac{C_2}{C_{02}}}}{2\pi\sqrt{L_2 C_2}} = f_r2\sqrt{1 + \frac{C_2}{C_{02}}} \quad \text{(Expression 10)}$$

Based on Expression 9 and Expression 10, as indicated by the characteristics of the resonator reso2 single unit in the upper graph of FIG. 12, the anti-resonant frequency fa2 appears on a higher frequency side than the resonant frequency fr2. Furthermore, the resonant frequency fr2 is higher than the resonant frequency fr1, and the anti-resonant frequency fa2 is higher than the anti-resonant frequency fa1.

The electrostatic capacitance $C_2$ is expressed by Expression 11 based on Expression 10, and the inductance $L_2$ is expressed by Expression 12 based on Expression 9.

[Math. 12]

$$C_2 = C_{02}\left(\left(\frac{f_a2}{f_r2}\right)^2 - 1\right) \quad \text{(Expression 11)}$$

[Math. 13]

$$L_2 = \frac{\left(\frac{1}{2\pi f_r 2}\right)^2}{C_2} \quad \text{(Expression 12)}$$

That is, the electrostatic capacitance $C_2$ is derived from the resonant frequency fr2, the anti-resonant frequency fa2, and the electrostatic capacitance $C_{02}$ of the resonator reso2. Furthermore, the inductance $L_2$ is derived from the resonant frequency fr2 and the electrostatic capacitance $C_2$ of the resonator reso2.

Next, a resonant frequency fr2_off of the path 2 at the time when the switch SW is OFF is a frequency at which an impedance Z of the equivalent circuit in FIG. 11C is 0, and is therefore expressed by Expression 14 by solving Expression 13.

[Math. 14]

$$Z = \quad \text{(Expression 13)}$$
$$0 = \frac{1}{\frac{1}{\frac{1}{j\omega_{r2off} C_{02}} + j\omega_{r2off} L_2 + \frac{1}{j\omega_{r2off} C_2}}} + \frac{1}{j\omega_{r2off} C_{off}}$$

[Math. 15]

$$f_r2\_off = \frac{\sqrt{\frac{C_{02} + C_2 + C_{off}}{L_2 C_2 C_{off} + L_2 C_{02} C_2}}}{2\pi} \quad \text{(Expression 14)}$$

Furthermore, an anti-resonant frequency fa2_off of the path 2 at the time when the switch SW is OFF is a frequency at which an admittance Y of the resonator reso2 in FIG. 11C is 0, and is therefore expressed by Expression 16 by solving Expression 15.

[Math. 16]

$$Y = 0 = \frac{1}{\frac{1}{j\omega_{a2off} C_{02}}} + \frac{1}{j\omega_{a2off} L_2 + \frac{1}{j\omega_{a2off} C_2}} \quad \text{(Expression 15)}$$

[Math. 17]

$$f_a2\_off = f_a2 = \frac{\sqrt{1 + \frac{C_2}{C_{02}}}}{2\pi\sqrt{L_2 C_2}} = f_r2\sqrt{1 + \frac{C_2}{C_{02}}} \quad \text{(Expression 16)}$$

Based on Expression 14 and Expression 16, as indicated by the characteristics of resonator reso2+Coff in the upper graph of FIG. 12, the resonant frequency fr2_off at the time when the switch SW is OFF appears on a higher frequency side than the resonant frequency fr2 at the time when the switch SW is ON. Furthermore, an anti-resonant frequency fa2_off at the time when the switch SW is OFF is the same as the anti-resonant frequency fa2 at the time when the switch SW is ON.

Next, two resonant frequencies frL_on and frH_on and two anti-resonant frequencies faL_on and faH_on of the parallel-arm resonant circuit at the time when the switch SW is ON will be obtained.

First, the resonant frequency frL_on is a frequency at which the impedance Z of the series circuit including the capacitor ($C_1$) and the inductor ($L_1$) is 0 in the equivalent circuit in FIG. 11E, and is therefore expressed by Expression 17.

[Math. 18]

$$f_rL\_on = f_r1 = \frac{1}{2\pi\sqrt{L_1 C_1}} \quad \text{(Expression 17)}$$

Furthermore, the resonant frequency frH_on is a frequency at which the impedance Z of the series circuit including the capacitor ($C_2$) and the inductor ($L_2$) is 0, and is therefore expressed by Expression 18.

[Math. 19]

$$f_rH\_on = f_r2 = \frac{1}{2\pi\sqrt{L_2 C_2}} \quad \text{(Expression 18)}$$

Furthermore, the anti-resonant frequencies faL_on and faH_on are frequencies at which the admittance Y of the equivalent circuit in FIG. 11E is 0, and is therefore expressed by Expression 20 by solving Expression 19.

[Math. 20]

$$Y = 0 = j\omega_{aon}C_0 + \cfrac{1}{j\omega_{aon}L_1 + \cfrac{1}{j\omega_{aon}C_1}} + \cfrac{1}{j\omega_{aon}L_2 + \cfrac{1}{j\omega_{aon}C_2}}$$ (Expression 19)

[Math. 21]

$$f_aL\_on = \frac{\sqrt{\dfrac{-b - \sqrt{b^2 - 4ac}}{2a}}}{2\pi}$$ (Expression 20)

$$f_aH\_on = \frac{\sqrt{\dfrac{-b + \sqrt{b^2 - 4ac}}{2a}}}{2\pi}$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

Next, the two resonant frequencies frL_off and frH_off and the two anti-resonant frequencies faL_off and faH_off of the parallel-arm resonant circuit at the time when the switch SW is OFF will be obtained.

First, the resonant frequency frL_off is a frequency at which the impedance Z of the series circuit including the capacitor ($C_1$) and the inductor ($L_1$) is 0 in the equivalent circuit in FIG. 11F, and is therefore expressed by Expression 21.

[Math. 22]

$$f_rL\_off = f_rL\_on = f_r1 = \frac{1}{2\pi\sqrt{L_1 C_1}}$$ (Expression 21)

Furthermore, the resonant frequency frH_off is a frequency at which the impedance Z of the series circuit including the resonator reso2 and the capacitor ($C_{off}$) is 0 in the equivalent circuit in FIG. 11F, and is expressed by Expression 23 by solving Expression 22.

[Math. 23]

$$Z = 0 = \cfrac{1}{\cfrac{1}{\cfrac{1}{j\omega_{rHoff}C_{02}}} + \cfrac{1}{j\omega_{rHoff}L_2 + \cfrac{1}{j\omega_{rHoff}C_2}}} + \cfrac{1}{j\omega_{rHoff}C_{off}}$$ (Expression 22)

[Math. 24]

$$f_rH\_off = f_r2\_off = \frac{\sqrt{\dfrac{C_{02} + C_2 + C_{off}}{L_2 C_2 C_{off} + L_2 C_{02} C_2}}}{2\pi}$$ (Expression 23)

Furthermore, the anti-resonant frequencies faL_off and faH_off are frequencies at which the admittance Y of the equivalent circuit in FIG. 11F is 0, and is therefore expressed by Expression 25 by solving Expression 24.

[Math. 25]

$$Y = 0 = \cfrac{1}{\cfrac{1}{j\omega_{aoff}C_{01}}} + \cfrac{1}{j\omega_{aoff}L_1 + \cfrac{1}{j\omega_{off}C_1}} + \cfrac{1}{\cfrac{1}{\cfrac{1}{\cfrac{1}{j\omega_{aoff}C_{02}}} + \cfrac{1}{j\omega_{aoff}L_2 + \cfrac{1}{j\omega_{aoff}C_2}}} + \cfrac{1}{j\omega_{aoff}C_{off}}}$$ (Expression 24)

[Math. 26]

$$faL\_off = \frac{\sqrt{\dfrac{-B - \sqrt{B^2 - 4AC}}{2A}}}{2\pi}$$ (Expression 25)

$$faH\_off = \frac{\sqrt{\dfrac{-B + \sqrt{B^2 - 4AC}}{2A}}}{2\pi}$$

$$A = L_1 L_2 C_{01} C_1 C_2 C_{off} +$$
$$L_1 L_2 C_{01} C_{02} C_1 C_2 + L_1 L_2 C_{02} C_1 C_2 C_{off}$$
$$B = -L_1 C_{01} C_1 C_{off} - L_1 C_{01} C_{02} C_1 - L_1 C_{01} C_1 C_2 -$$
$$L_2 C_{01} C_2 C_{off} - L_2 C_{01} C_{02} C_2 -$$
$$L_2 C_1 C_2 C_{off} - L_2 C_{02} C_1 C_2 - L_1 C_{02} C_1 C_{off} -$$
$$L_1 C_1 C_2 C_{off} - L_2 C_{02} C_2 C_{off}$$
$$C = C_{01} C_{off} + C_{01} C_{02} + C_{01} C_2 + C_1 C_{off} +$$
$$C_{02} C_1 + C_1 C_2 + C_{02} C_{off} + C_2 C_{off}$$

Based on Expression 20, Expression 21, Expression 23, and Expression 25, as indicated by the impedance characteristics of the parallel-arm resonant circuit in the lower graph of FIG. 12, the resonant frequencies frL_on and frH_on at the time when the switch SW is ON and the anti-resonant frequencies faL_on and faH_on at the time when the switch SW is ON are defined. Furthermore, the resonant frequencies frL_off (=frL_on) and frH_off at the time when the switch SW is OFF and the anti-resonant frequencies faL_off and faH_off at the time when the switch SW is OFF are defined.

The resonant frequency frH_on the higher frequency side, out of the two resonant frequencies frL and frH of the parallel-arm resonant circuit, is shifted according to on and off of the switch SW. Therefore, the amount ΔfrH of frequency shift based on turning ON and OFF of the switch SW of the parallel-arm resonant circuit is expressed by Expression 26.

[Math. 27]

$$\Delta f_r H = f_r H\_off - f_r H\_on = \frac{\sqrt{\dfrac{C_{02} + C_2 + C_{off}}{L_2 C_2 C_{off} + L_2 C_{02} C_2}}}{2\pi} - \frac{1}{2\pi\sqrt{L_2 C_2}}$$ (Expression 26)

In the acoustic wave filter 10A according to this embodiment, the amount ΔfrH of frequency shift (resonant frequency difference), which is a frequency difference between the frequency of an attenuation pole on the higher frequency side of the pass band (the resonant frequency frH_off on the higher frequency side) in the transmission characteristics at the time when the switch SW is OFF (second filter characteristics) and the frequency of an attenuation pole on the higher frequency side of the pass band (resonant frequency frH_on on the higher frequency side) in the transmission characteristics at the time when the switch SW is ON (first filter characteristics), is equal to or more than a frequency difference $\Delta f_{FIL}$ (attenuation band frequency difference) between the low frequency end frequency $f_{R2L}$ in the second attenuation band and the low frequency end frequency $f_{R1L}$ in the first attenuation band. That is, Expression 27 is satisfied.

[Math. 28]

$$\Delta f_{FIL} \leq f_r H = f_r H\_\text{off} - f_r H\_\text{on} \quad \text{(Expression 27)}$$

Based on Expression 26 and Expression 27, the range of the off capacitance $C_{off}$ is defined by Expression 28.

[Math. 29]

$$C_{off} \leq \frac{L_2 C_{02} C_2 \left(2\pi \Delta f_{FIL} + \frac{1}{\sqrt{L_2 C_2}}\right)^2 - C_{02} - C_2}{1 - L_2 C_2 \left(2\pi \Delta f_{FIL} + \frac{1}{\sqrt{L_2 C_2}}\right)^2} \quad \text{(Expression 28)}$$

FIG. 13A is a graph indicating the impedance characteristics of the resonators and the resonant circuit configuring the parallel-arm resonant circuit in the case where the capacitance value of the off capacitance $C_{off}$ is varied. Furthermore, FIG. 13B is a graph indicating the relationship of the off capacitance value and the amount of shift of the resonant frequency and the anti-resonant frequency of the parallel-arm resonant circuit.

The upper graph of FIG. 13A indicates variations in impedance characteristics of the parallel-arm resonator p1 and the frequency variable circuit in the case where the capacitance value of the off capacitance $C_{off}$ is varied within a range from 0.1 pF to 6.4 pF. Furthermore, the lower graph of FIG. 13A indicates variations in the impedance characteristics of the parallel-arm resonant circuit in the case where the capacitance value of the off capacitance $C_{off}$ is varied within a range from 0.1 pF to 6.4 pF.

In FIG. 13B, results of the relationship of the capacitance value of the off capacitance $C_{off}$, the amount $\Delta frL$ of frequency shift of the resonant frequency on the lower frequency side based on turning ON and OFF of the switch SW, the amount $\Delta frH$ of frequency shift of the resonant frequency on the higher frequency side, the amount $\Delta faL$ of frequency shift of the anti-resonant frequency on the lower frequency side, and the amount $\Delta faH$ of frequency shift of the anti-resonant frequency on the higher frequency side, which is derived from Expressions 1 to 28, are illustrated. Parameters used for the above derivation are illustrated in Table 2.

TABLE 2

| | | | | | |
|---|---|---|---|---|---|
| Parallel-arm resonator p1 | Resonant frequency fr1(MHz) 725 | Anti-resonant frequency fa1(MHz) 755.5 | Electrostatic capacitance $C_{01}$(pF) 6.0 | Inductance $L_1$(nH) 93.65 | Electrostatic capacitance $C_1$(pF) 0.515 |
| Parallel-arm resonator p2 | Resonant frequency fr2(MHz) 779 | Anti-resonant frequency fa2(MHz) 811.7 | Electrostatic capacitance $C_{02}$(pF) 0.5 | Inductance $L_2$(nH) 973.4 | Electrostatic capacitance $C_2$(pF) 0.043 |
| Off capacitance $C_{off}$(pF) | | | 0.10-6.40 | | |

In the case where the acoustic wave filter 10A according to this embodiment is applied to a reception filter that switches between Band 13 and Band 14, as is clear from Table 1, the frequency difference $\Delta f_{FIL}$ is a frequency difference between the low frequency end frequency $f_{R2L}$ (788 MHz) in the second attenuation band and the low frequency end frequency $f_{R1L}$ (777 MHz) in the first attenuation band, which is 11 MHz. In the case where the relationship expressed by Expression 20 is applied to the graph of FIG. 13B, the range of the off capacitance $C_{off}$ is calculated as being 1.16 pF or below.

Furthermore, it is desirable that the off capacitance $C_{off}$ be smaller than the electrostatic capacitance $C_{02}$ (0.5 pF) of the parallel-arm resonator p2. Accordingly, the resonant frequency frH_off (frp4) of the parallel-arm resonant circuit at the time when the switch SW is OFF is not lower than the attenuation pole configured of the anti-resonant frequency fas of the series-arm resonator s1. Thus, a large amount $\Delta frH$ of frequency shift can be ensured, and a large pass band width at the time when the switch SW is OFF can be ensured. In particular, degradation of the insertion loss in the radio frequency end of the pass can be suppressed.

[1.7 Configuration of Acoustic Wave Filter Device According to Modification]

FIG. 14 is a circuit configuration diagram of an acoustic wave filter 10B according to a modification of the first embodiment. As illustrated in FIG. 14, the acoustic wave filter 10B according to this modification is different from the acoustic wave filter 10A according to the first embodiment, in terms of circuit configuration, in that a plurality of frequency variable circuits each including a parallel-arm resonator and a switch element for band width adjustment that are connected in series are connected to the parallel-arm resonator p1 in a parallel manner. Hereinafter, explanation for the same features as those with the acoustic wave filter 10A according to the first embodiment will be omitted, and features different from the acoustic wave filter 10A according to the first embodiment will be focused on.

As illustrated in FIG. 14, the acoustic wave filter 10B includes a series-arm resonator s1, parallel-arm resonators p1, p21, p22, p23, and p24, switches SW1, SW2, SW3, and SW4, and input/output terminals 110 and 120.

The parallel-arm resonator p1 is a first acoustic wave resonator that is connected between a node x1 and the ground, and the parallel-arm resonators p21 to p24 are second acoustic wave resonators that are connected between the node x1 and the ground.

The switches SW1 to SW4 are arranged between the node x1 and the ground and are connected in series with the parallel-arm resonators p21 to p24. Accordingly, the switch SW1 and the parallel-arm resonator p21 configure a first frequency variable circuit, the switch SW2 and the parallel-arm resonator p22 configure a second frequency variable circuit, the switch SW3 and the parallel-arm resonator p23 configure a third frequency variable circuit, and the switch SW4 and the parallel-arm resonator p24 configure a fourth frequency variable circuit. That is, a plurality of frequency variable circuits are connected between the node x1 and the ground in a parallel manner.

In the acoustic wave filter 10B, the connection order of the parallel-arm resonator p21 and the switch SW1, the connection order of the parallel-arm resonator p22 and the switch SW2, the connection order of the parallel-arm resonator p23 and the switch SW3, and the connection order of the parallel-arm resonator p24 and the switch SW4 may be any order. However, as illustrated in FIG. 14, it is preferable that the parallel-arm resonators p21, p22, p23, and p24 be arranged closer to the node x1 than the switches SW1, SW2, SW3, and SW4 are. This is because, if the switches SW1 to SW4 are arranged closer to the node x1, loss of the acoustic wave filter 10B increases due to resistance components of the switches SW1 to SW4 at the time when the switches are ON.

The resonant frequencies of the parallel-arm resonators p21 to p24 may be different from one another. Accordingly, in the band pass characteristics defined by the series-arm resonator s1 and the parallel-arm resonator p1, a fine adjustment of a band width can be achieved by selecting, in a desired manner, the switches SW1 to SW4 to be electrically connected.

Furthermore, in the acoustic wave filter 10B, in predetermined two filter characteristics selected according to turning ON and OFF of the switches SW1 to SW4, the relationship of Expression 27 is satisfied. Accordingly, a sufficient amount of frequency shift of an attenuation band can be ensured by switching between conduction and non-conduction of the switches SW1 to SW4.

The resonant frequencies of all the parallel-arm resonators p21 to p24 may be the same. In this case, resistance at the time when the switches are ON can be reduced, and loss in the pass band can thus be reduced.

Second Embodiment

In the first embodiment, a configuration in which the parallel-arm resonator p1 and the switch SW1 for varying transmission characteristics are added to one series-arm resonator s1 and one parallel-arm resonator p2 is described. In a second embodiment, an acoustic wave filter having a plurality of stages of filter structure in a case where a combination of a series-arm circuit and a parallel-arm circuit is defined as one stage of filter structure, will be described.

[2.1 Configuration of Acoustic Wave Filter Device]

FIG. 15 is a circuit configuration diagram of an acoustic wave filter 10C according to the second embodiment. Hereinafter, explanation for the same features as those with the acoustic wave filter 10A according to the first embodiment will be omitted, and different features will be focused on.

As illustrated in FIG. 15, the acoustic wave filter 10C includes series-arm resonators s1, s2, s3, s4, and s5, parallel-arm circuits 13p1, 13p2, 13p3, 13p4, 13p5, and 13p6, and input/output terminals 110 and 120.

The series-arm resonators s1 to s5 each form a series-arm circuit and are arranged on a path between the input/output terminals 110 and 120.

The parallel-arm circuit 13p1 is connected between a node x1 on the path between the input/output terminals 110 and 120 and the ground and includes a parallel-arm resonator p1a. The parallel-arm circuit 13p2 is connected between a node x2 on the path between the input/output terminals 110 and 120 and the ground and includes a parallel-arm resonator p2a. The parallel-arm circuit 13p6 is connected between a node x6 on the path between the input/output terminals 110 and 120 and the ground and includes a parallel-arm resonator p6a.

The parallel-arm circuit 13p3 is a parallel-arm resonant circuit that is connected between a node x3 on the path between the input/output terminals 110 and 120 and the ground and includes a parallel-arm resonator (first acoustic wave resonator) p3a and a frequency variable circuit 73p. The frequency variable circuit 73p is a circuit in which a parallel-arm resonator (second acoustic wave resonator) p3b and a switch SW3 are connected in series. The parallel-arm circuit 13p4 is a parallel-arm resonant circuit that is connected between a node x4 on the path between the input/output terminals 110 and 120 and the ground and includes a parallel-arm resonator (first acoustic wave resonator) p4a and a frequency variable circuit 74p. The frequency variable circuit 74p is a circuit in which a parallel-arm resonator (second acoustic wave resonator) p4b and a switch SW4 are connected in series. The parallel-arm circuit 13p5 is a parallel-arm resonant circuit that is connected between a node x5 on the path between the input/output terminals 110 and 120 and the ground and includes a parallel-arm resonator (first acoustic wave resonator) p5a and a frequency variable circuit 75p. The frequency variable circuit 75p is a circuit in which a parallel-arm resonator (second acoustic wave resonator) p5b and a switch SW5 are connected in series.

With the above configuration, the acoustic wave filter 10C configures a ladder filter circuit of a frequency variable type. In the acoustic wave filter 10C according to this embodiment, each of the three parallel-arm circuits 13p3 to 13p5, out of the plurality of parallel-arm circuits 13p1 to 13p6, includes a frequency variable circuit.

In the acoustic wave filter 10C, in two filter characteristics selected by switching between turning ON and OFF of the switches SW3 to SW5, the relationship represented by Expression 27 is satisfied. Accordingly, a sufficient amount of frequency shift of an attenuation band can be ensured by switching between conduction and non-conduction of the switches SW3 to SW5.

FIG. 16 is a graph indicating transmission characteristics of the acoustic wave filter 10C according to the second embodiment. For example, the acoustic wave filter 10C according to this embodiment has first filter characteristics in which Band 38 (2,570 MHz to 2,620 MHz) is defined as a first pass band, a range from 2,645 MHz to 2,670 is defined as a first attenuation band, and ISM2.4 (2,400 MHz to 2,480 MHz) is defined as another attenuation band and second filter characteristics in which Band 41 (2,496 MHz to 2,690 MHz) is defined as a second pass band, a range from 2,730 to 2,950 is defined as a second attenuation band, and ISM2.4 (2,400 MHz to 2,480 MHz) is defined as another attenuation band. By switching between turning ON and OFF of the switches SW3 to SW5 at the same time, switching between the first filter characteristics and the second filter characteristics can be performed.

In this embodiment, the amount $\Delta frH$ of frequency shift, which is a resonant frequency difference between the frequency of an attenuation pole on the higher frequency side of the pass band (resonant frequency frH_off) in the transmission characteristics at the time when the switches SW3 to SW5 are OFF (second filter characteristics) and the frequency of an attenuation pole on the higher frequency side of the pass band (resonant frequency frH_on) in the transmission characteristics at the time when the switches SW3 to SW5 are ON (first filter characteristics), is equal to or more than the frequency difference $\Delta f_{FIL}$ (attenuation band frequency difference: 85 MHz) between the low frequency end frequency (2,730 MHz) in the second attenuation band and the low frequency end frequency (2,645 MHz) in the first attenuation band. That is, Expression 27 is satisfied. As the off capacitance $C_{off}$ that satisfies Expression 27 and Expression 28, in this embodiment, $C_{off}$ is set to 0.20 pF. Table 3 indicates resonant frequency fr, anti-resonant frequency fa, and electrostatic capacitance of each resonator. Electrostatic capacitance in Table 3 does not represent a virtual capacitance that defines the resonant frequency of each resonator but represents the electrostatic capacitance of each resonator. For example, electrostatic capacitance $C_{01}$ is indicated for the parallel-arm resonators p1a, p2a, p3a, p4a, p5a, and p6a and the series-arm resonators s1, s2, s3, s4, and s5, and electrostatic capacitance $C_{02}$ is indicated for the parallel-arm resonators p3b, p4b, and p5b.

TABLE 3

| | Resonant frequency fr(MHz) | Anti-resonant frequency fa(MHz) | Electrostatic capacitance (pF) |
|---|---|---|---|
| Series-arm resonator s1 | 2630.5 | 2827.8 | 0.69 |
| Series-arm resonator s2 | 2624.9 | 2821.8 | 8.05 |
| Series-arm resonator s3 | 2550.6 | 2741.9 | 1.33 |
| Series-arm resonator s4 | 2550.0 | 2741.3 | 0.75 |
| Series-arm resonator s5 | 2580.9 | 2774.5 | 0.66 |
| Parallel-arm resonator p1a | 2454.8 | 2638.9 | 0.98 |
| Parallel-arm resonator p2a | 2440.7 | 2623.8 | 0.72 |
| Parallel-arm resonator p3a | 2462.7 | 2647.4 | 0.33 |
| Parallel-arm resonator p4a | 2413.7 | 2594.7 | 1.81 |
| Parallel-arm resonator p5a | 2368.8 | 2546.5 | 1.41 |

TABLE 3-continued

| | Resonant frequency fr(MHz) | Anti-resonant frequency fa(MHz) | Electrostatic capacitance (pF) |
|---|---|---|---|
| Parallel-arm resonator p6a | 2476.9 | 2662.7 | 0.30 |
| Parallel-arm resonator p3b | 2696.8 | 2899.1 | 0.25 |
| Parallel-arm resonator p4b | 2700.0 | 2902.5 | 0.25 |
| Parallel-arm resonator p5b | 2665.6 | 2865.5 | 0.25 |
| Off capacitance $C_{off}$(pF) | | 0.20 | |

FIG. 17 is a graph indicating transmission characteristics of the acoustic wave filter 10C according to the second embodiment and impedance characteristics of resonators and a resonant circuit configuring a parallel-arm circuit. In the upper left part of FIG. 17, the transmission characteristics of the acoustic wave filter 10C based on switching between turning ON and OFF of the switches SW3 to SW5 are illustrated. In the lower left part of FIG. 17, the impedance characteristics of the parallel-arm circuit 13p3 based on switching between turning ON and OFF of the switch SW3 are illustrated. In the upper right part of FIG. 17, the impedance characteristics of the parallel-arm circuit 13p4 based on switching between turning ON and OFF of the switch SW4 are illustrated. In the lower right part of FIG. 17, the impedance characteristics of the parallel-arm circuit 13p5 based on switching between turning ON and OFF of the switch SW5 are illustrated.

FIG. 18 is a graph indicating comparison of transmission characteristics in the case where the off capacitance $C_{off}$ of the acoustic wave filter according to the second embodiment is varied. Furthermore, resonant parameters for the parallel-arm circuits 13p3, 13p4, and 13p5 are illustrated in Table 4. In FIG. 18, to clearly indicating differences in transmission characteristics, transmission characteristics only in the case where the off capacitance $C_{off}$ is within a range from 0.05 pF to 0.35 pF are illustrated. In actuality, however, as indicated in Table 4, transmission characteristics are obtained in the case where the off capacitance $C_{off}$ is varied in a range from 0.05 pF to 0.55 pF.

TABLE 4

| | Resonant frequency | Anti-resonant frequency | Electrostatic capacitance | Inductance | Electrostatic capacitance |
|---|---|---|---|---|---|
| Parallel-arm resonator p3a | fr1(MHz) | fa1(MHz) | $C_{01}$(pF) | $L_1$(nH) | $C_1$(pF) |
| | 2462.7 | 2647.4 | 0.33 | 81.325 | 0.051 |
| Parallel-arm resonator p3b | fr2(MHz) | fa2(MHz) | $C_{02}$(pF) | $L_2$(nH) | $C_2$(pF) |
| | 2696.8 | 2899.1 | 0.25 | 89.521 | 0.039 |
| Parallel-arm resonator p4a | fr1(MHz) | fa1(MHz) | $C_{01}$(pF) | $L_1$(nH) | $C_1$(pF) |
| | 2413.7 | 2594.7 | 1.81 | 15.435 | 0.282 |
| Parallel-arm resonator p4b | fr2(MHz) | fa2(MHz) | $C_{02}$(pF) | $L_2$(nH) | $C_2$(pF) |
| | 2700.0 | 2902.5 | 0.25 | 89.309 | 0.039 |
| Parallel-arm resonator p5a | fr1(MHz) | fa1(MHz) | $C_{01}$(pF) | $L_1$(nH) | $C_1$(pF) |
| | 2462.7 | 2647.4 | 0.33 | 81.325 | 0.051 |

TABLE 4-continued

| Parallel-arm resonator p5b | Resonant frequency fr2(MHz) | Anti-resonant frequency fa2(MHz) | Electrostatic capacitance $C_{02}$(pF) | Inductance $L_2$(nH) | Electrostatic capacitance $C_2$(pF) |
|---|---|---|---|---|---|
|  | 2696.8 | 2899.1 | 0.25 | 89.521 | 0.039 |
| Off capacitance $C_{off}$(pF) |  |  | 0.05-0.55 |  |  |

As illustrated in FIG. 18, the amount of attenuation in the second attenuation band can be increased as the off capacitance $C_{off}$ decreases, and insertion loss in the radio frequency end of the second pass band can be decreased ensuring a pass band width as the off capacitance $C_{off}$ decreases. In this embodiment, the off capacitance $C_{off}$ (maximum value) calculated by Expression 28 is 0.35 pF.

FIG. 19 is a graph indicating the relationship of the off capacitance $C_{off}$ and insertion loss of the acoustic wave filter 10C according to the second embodiment. As illustrated in FIG. 19, the insertion loss of the second pass band increases as the off capacitance $C_{off}$ increases. The off capacitance $C_{off}$ calculated by Expression 28 is 0.35 pF. If the off capacitance $C_{off}$ is 0.35 pF or less, an insertion loss of 4.5 dB or less can be achieved. Furthermore, by setting the off capacitance $C_{off}$ to be smaller than the electrostatic capacitance of the parallel-arm resonators p3b, p4b, and p5b (=0.25 pF), the insertion loss can be improved down to about 2.0 dB.

In this embodiment, switching in two modes between collectively turning ON and turning OFF the switches SW3 to SW5 is explained. However, the switches SW3 to SW5 may be turned ON and OFF individually. Accordingly, finer adjustment of a pass band width and the frequency of an attenuation band can be achieved.

Furthermore, in this embodiment, the number of parallel-arm resonant circuits of the acoustic wave filter 10C is not limited to six, and the number of series-arm circuits is not limited to five. Furthermore, each of the series-arm circuits including the series-arm resonators s1 to s5 and each of the parallel-arm circuits 13p1, 13p2, and 13p6 may not be configured of an acoustic wave resonator but may be an LC resonant circuit or an impedance circuit including an inductance L, a capacitance C, and the like.

Third Embodiment

The acoustic wave filters according to the first and second embodiments have a ladder filter structure. In contrast, in a third embodiment, an acoustic wave filter having a longitudinally-coupled filter structure will be explained.

FIG. 20 is a circuit configuration diagram of an acoustic wave filter 10D according to the third embodiment. The acoustic wave filter 10D according to this embodiment is different from the acoustic wave filter 10A according to the first embodiment in that a longitudinally-coupled filter structure is added. Hereinafter, explanation for the same features as those with the acoustic wave filter 10A according to the first embodiment will be omitted, and different features will be focused on.

As illustrated in FIG. 20, the acoustic wave filter 10D includes series-arm resonators s1, s2, and s3, parallel-arm resonators p11, p1, and p2, a switch SW1, and a longitudinally-coupled resonator 250.

The acoustic wave filter 10D configures a ladder filter circuit including the series-arm resonators s1 to s3 and the parallel-arm resonators p11 and p1. Furthermore, in the acoustic wave filter 10D, the longitudinally-coupled resonator 250 is additionally provided in the ladder filter circuit.

The longitudinally-coupled resonator 250 is configured of three IDTs and reflectors that are arranged at ends of the IDTs. With the added longitudinally-coupled resonator 250, required filter characteristics such as an increased band width and an improved attenuation can be adapted.

Each of the series-arm resonators s1 to s3 configures a series-arm circuit and is arranged on a path between input/output terminals. The parallel-arm resonator p1 is a first acoustic wave resonator that is connected between a node x1 on the path between the input/output terminals and the ground. The parallel-arm resonator p2 and the switch SW1 are connected in series and configure a frequency variable circuit. The frequency variable circuit is connected in parallel with the parallel-arm resonator p1. The parallel-arm resonators p1 and p2 and the switch SW1 configure a parallel-arm resonant circuit. The frequency variable circuit has a function for varying a resonant frequency and anti-resonant frequency of the parallel-arm resonant circuit. The parallel-arm resonator p2 is a second acoustic wave resonator that has a resonant frequency higher than the resonant frequency of the parallel-arm resonator p1 and an anti-resonant frequency higher than the anti-resonant frequency of the parallel-arm resonator p1. The switch SW1 is a switch element that switches between conduction and non-conduction of the path going through the node x1, the parallel-arm resonator p2, and the ground.

The parallel-arm resonant circuit, the series-arm resonators s1 to s3, and the parallel-arm resonator p11 configure a frequency-variable ladder filter unit.

In the acoustic wave filter 10D according to this embodiment, the amount ΔfrH of frequency shift, which is a resonant frequency difference between the frequency of the attenuation pole on the higher frequency side of the pass band (resonant frequency frH_off) in the transmission characteristics at the time when the switch SW1 is OFF (second filter characteristics) and the frequency of the attenuation pole on the higher frequency side of the pass band (resonant frequency frH_on) in the transmission characteristics at the time when the switch SW1 is ON (first filter characteristics), is equal to or more than the frequency difference $\Delta f_{FIL}$ (attenuation band frequency difference) between the low frequency end frequency $f_{R2L}$ in the second attenuation band at the time when the switch SW1 is OFF and the low frequency end frequency $f_{R1L}$ in the first attenuation band at the time when the switch SW1 is ON. That is, Expression 27 is satisfied. Accordingly, a sufficient amount of frequency shift of an attenuation band can be ensured by switching between conduction and non-conduction of the switch SW1.

Fourth Embodiment

In a fourth embodiment, a duplexer in which the acoustic wave filters according to the first to third embodiments are applied to a transmission-side filter and a reception-side filter will be explained.

FIG. 21 is a circuit configuration diagram of a duplexer 10E according to the fourth embodiment. The duplexer 10E illustrated in FIG. 21 includes a transmission-side filter Tx and a reception-side filter Rx. The transmission-side filter Tx is connected to an input terminal 220*t* and a common terminal 220*c*, and the reception-side filter Rx is connected to the common terminal 220*c* and an output terminal 220*r*.

The transmission-side filter Tx is a ladder filter circuit that includes series-arm resonators 221*s* to 224*s*, a parallel-arm resonator 221*p*1, and parallel-arm resonators (first acoustic wave resonators) 222*p*1 to 224*p*1. The transmission-side filter Tx has four stages of filter structure. The transmission-side filter Tx further includes parallel-arm resonators (second acoustic wave resonators) 222*p*2 to 224*p*2 for varying transmission characteristics and switches (switch elements) 222SW to 224SW. Three stages, out of the plurality of stages, of filter structure each include a frequency variable circuit in which a second acoustic wave resonator and a switch element are connected in series.

The resonant frequency of the parallel-arm resonator 222*p*2 is higher than the resonant frequency of the parallel-arm resonator 222*p*1, the resonant frequency of the parallel-arm resonator 223*p*2 is higher than the resonant frequency of the parallel-arm resonator 223*p*1, and the resonant frequency of the parallel-arm resonator 224*p*2 is higher than the resonant frequency of the parallel-arm resonator 224*p*1.

Furthermore, the amount ΔfrH of frequency shift, which is a resonant frequency difference between the frequency of the attenuation pole on the higher frequency side of the pass band (resonant frequency frH_off) in the transmission characteristics at the time when the switches 222SW, 223SW, and 224SW are OFF (second filter characteristics) and the frequency of the attenuation pole on the higher frequency side of the pass band (resonant frequency frH_on) in the transmission characteristics at the time when the switches 222SW, 223SW, and 224SW are ON (first filter characteristics), is equal to or more than the frequency difference $\Delta f_{FIL}$ (attenuation band frequency difference) between the low frequency end frequency $f_{R2L}$ in the second attenuation band at the time when the switches 222SW, 223SW, and 224SW are OFF and the low frequency end frequency $f_{R1L}$ in the first attenuation band at the time when the switches 222SW, 223SW, and 224SW are ON. That is, Expression 27 is satisfied. Accordingly, a sufficient amount of frequency shift of an attenuation band can be ensured by switching between conduction and non-conduction of the switches 222SW, 223SW, and 224SW.

The reception-side filter Rx is a ladder filter circuit that includes series-arm resonators 261*s* to 264*s*, a parallel-arm resonator 261*p*1, and parallel-arm resonators (first acoustic wave resonators) 262*p*1 to 264*p*1. The reception-side filter Rx has four stages of filter structure. The reception-side filter Rx further includes parallel-arm resonators (second acoustic wave resonators) 262*p* to 264*p* for varying transmission characteristics and switches (switch elements) 262SW to 264SW. Three stages, out of the plurality of stages, of filter structure each include a second parallel-arm resonator and a switch element.

The resonant frequency of the parallel-arm resonator 262*p*2 is higher than the resonant frequency of the parallel-arm resonator 262*p*1, the resonant frequency of the parallel-arm resonator 263*p*2 is higher than the resonant frequency of the parallel-arm resonator 263*p*1, and the resonant frequency of the parallel-arm resonator 264*p*2 is higher than the resonant frequency of the parallel-arm resonator 264*p*1.

Furthermore, the amount ΔfrH of frequency shift, which is a resonant frequency difference between the frequency of the attenuation pole on the higher frequency side of the pass band (resonant frequency frH_off) in the transmission characteristics at the time when the switches 262SW, 263SW, and 264SW are OFF (second filter characteristics) and the frequency of the attenuation pole on the higher frequency side of the pass band (resonant frequency frH_on) in the transmission characteristics at the time when the switches 262SW, 263SW, and 264SW are ON (first filter characteristics), is equal to or more than the frequency difference $\Delta f_{FIL}$ (attenuation band frequency difference) between the low frequency end frequency $f_{R2L}$ in the second attenuation band at the time when the switches 262SW, 263SW, and 264SW are OFF and the low frequency end frequency $f_{R1L}$ in the first attenuation band at the time when the switches 262SW, 263SW, and 264SW are ON. That is, Expression 27 is satisfied. Accordingly, a sufficient amount of frequency shift of an attenuation band can be ensured by switching between conduction and non-conduction of the switches 262SW, 263SW, and 264SW.

With the configuration mentioned above, in the tunable duplexer that is applied to a system that exclusively selects two bands that are adjacent to each other, by switching of the switches 222SW to 224SW and the switches 262SW to 264SW, the transmission pass band and the reception pass band of the duplexer 10E can be adjusted. Furthermore, simplification and miniaturization of the duplexer 10E can be achieved.

The duplexer according to the present disclosure is not limited to the configuration mentioned above. Any of the acoustic wave filters according to the first to third embodiments can be applied to the transmission-side filter and the reception-side filter.

Furthermore, in the duplexer according to the present disclosure, the acoustic wave filters according to the first to third embodiments may be applied to only one of the transmission-side filter and the reception-side filter.

Fifth Embodiment

The acoustic wave filters and the duplexer explained in the first to fourth embodiments may also be applied to a radio frequency front end circuit that supports a system using a large number of bands. In a fifth embodiment, such a radio frequency front end circuit and a communication apparatus will be explained.

FIG. 22 is a configuration diagram of a communication apparatus 300 according to the fifth embodiment.

As illustrated in FIG. 22, the communication apparatus 300 includes a switch group 310 including a plurality of switches, a filter group 320 including a plurality of filters, a transmission-side switch 331, reception-side switches 332, 333, and 334, switches 335 and 336, transmission amplification circuits 341, 342, and 343, reception amplification circuits 351, 352, 353, and 354, an RF signal processing circuit (RFIC), a baseband signal processing circuit (BBIC), and an antenna element (ANT). The antenna element (ANT) may not be built in the communication apparatus 300.

The switch group 310 connects the antenna element (ANT) with signal paths corresponding to predetermined bands in accordance with a control signal from a control unit (not illustrated in the drawing), and includes, for example, a plurality of SPST switches. The number of signal paths connected to the antenna element (ANT) is not necessarily one but a plurality of signal paths may be connected to the antenna element (ANT). That is, the communication apparatus 300 may support carrier aggregation.

The filter group 320 includes a plurality of filters (including duplexers) having, for example, the bands listed below as pass bands. Specifically, the bands are (i) a transmission band of Bands 3, 4, and 66, (ii) a reception band of Band 3/a reception band of Bands 3 and 39 (the reception band of Band 3 and the reception band of Bands 3 and 39 are variable), (iii-Tx) a transmission band of Band 25, (iii-Rx) a reception band of Band 25, (iv) a transmission band of Band 1/a transmission band of Band 65 (the transmission band of Band 1 and the transmission band of Band 65 are variable), (v) a reception band of Bands 1, 4, 65, and 66, (vi-Tx) a transmission band of Band 30, (vi-Rx) a reception band of Band 30, (vii-Tx) a transmission band of Band 7, (vii-Rx) a reception band of Band 7/a reception band of Bands 7 and 38 (the reception band of Band 7 and the reception band of Bands 7 and 38 are variable), (viii) transmission and reception bands of Band 39, (ix) transmission and reception bands of Band 40, and (x) transmission and reception bands of Band 41/transmission and reception bands of Band 38 (the transmission and reception bands of Band 41 and the transmission and reception bands of Band 38 are variable).

The transmission-side switch 331 is a switch circuit that includes a plurality of selection terminals connected to a plurality of transmission-side signal paths and a common terminal connected to the transmission amplification circuit 341. The transmission-side switch 331 is a switch circuit that is provided in a stage preceding the filter group 320 (in this example, in the preceding stage in the transmission-side signal path) and switches the connection state in accordance with a control signal from a control unit (not illustrated in the drawing). Accordingly a radio frequency signal (in this example, a radio frequency transmission signal) amplified by the transmission amplification circuit 341 is outputted via a predetermined filter of the filter group 320 to the antenna element (ANT).

The reception-side switch 332 is a switch circuit that includes a plurality of selection terminals connected to a plurality of reception-side signal paths and a common terminal connected to the reception amplification circuit 351. The reception-side switch 333 is a switch circuit that includes a plurality of selection terminals connected to a plurality of reception-side signal paths and a common terminal connected to the reception amplification circuit 352. The reception-side switch 334 is a switch circuit that includes a plurality of selection terminals connected to a plurality of reception-side signal paths and a common terminal connected to the reception amplification circuit 353. The reception-side switches 332 to 334 are provided in a stage following the filter group 320 (in this example, the following stage in the reception-side signal path), and the connection state is switched in accordance with a control signal from a control unit (not illustrated in the drawing). Accordingly, radio frequency signals (in this example, radio frequency reception signals) inputted to the antenna element (ANT) pass through predetermined filters of the filter group 320, are amplified by the reception amplifier circuits 351, 352, and 353, and are outputted to the RF signal processing circuit (RFIC).

The switch 335 is a switch circuit that includes a common terminal connected to a signal path for a predetermined band (in this example, Band 39) and two selection terminals that are connected to a selection terminal of the reception-side switch 334 and an output terminal of the transmission amplification circuit 342. The switch 336 is a switch circuit that includes two selection terminals connected to a signal path for Band 40 and a signal path for Band 41/38 and two selection terminals connected to an output terminal of the transmission amplification circuit 343 and an input terminal of the reception amplification circuit 354.

The transmission amplification circuits 341, 342, and 343 are power amplifiers for power-amplifying a radio frequency transmission signal.

The reception amplification circuits 351, 352, 353, and 354 are low-noise amplifiers for power-amplifying a radio frequency reception signal.

The RF signal processing circuit (RFIC) is a circuit that processes a radio frequency signal transmitted and received by the antenna element (ANT). Specifically, the RF signal processing circuit (RFIC) performs signal processing, by down conversion or the like, for a radio frequency signal (in this example, a radio frequency reception signal) inputted from the antenna element (ANT) via the reception-side signal path, and outputs a reception signal generated by the signal processing to a baseband signal processing circuit (BBIC). Furthermore, the RF signal processing circuit (RFIC) performs signal processing, by up conversion or the like, for a transmission signal inputted from the baseband signal processing circuit (BBIC), and outputs a radio frequency signal (in this example, a radio frequency transmission signal) generated by the signal processing to the transmission-side signal path.

The communication apparatus 300 configured as described above includes, for example, an acoustic wave filter according to any one of the first to third embodiments, as a filter that includes transmission and reception bands for (x) Band 41/transmission and reception bands for Band 38. That is, the filter switches a pass band in accordance with a control signal.

The switch group 310, the filter group 320, the transmission-side switch 331, the reception-side switches 332, 333, and 334, the switches 335 and 336, the transmission amplification circuits 341, 342, and 343, and the reception amplification circuits 351, 352, 353, and 354 in the communication apparatus 300 and the control unit mentioned above configure a radio frequency front end circuit.

Although not illustrated in FIG. 22, the control unit may be included in the RF signal processing circuit (RFIC), or the control unit and switches controlled by the control unit may configure a switch IC.

In the RF front end circuit and the communication apparatus 300 configured as described above, with provision of the acoustic wave filter according to any one of the first to third embodiments or the duplexer according to the fourth embodiment, switching between the signal paths for two frequency bands can be achieved while a sufficient amount of frequency shift of an attenuation band is ensured by switching between conduction and non-conduction of a switch element.

Furthermore, the radio frequency front end circuit according to this embodiment includes the transmission-side switch 331, the reception-side switches 332, 333, and 334, and the switches 335 and 336 (switch circuits) that are provided in a stage preceding or following the filter group 320 (a plurality of radio frequency filters). Accordingly, part of signal paths through which radio frequency signals are transmitted can be used in common. Therefore, for example, the transmission amplification circuits 341 to 343 or the reception amplification circuits 351 to 354 (amplification circuits) corresponding to a plurality of radio frequency filters can be used in common. Thus, reductions in the size and cost of the RF front end circuit can be achieved.

At least one of the transmission-side switch 331, the reception-side switches 332, 333, and 334, and the switches 335 and 336 may be provided. Furthermore, the number of transmission-side switches and the number of reception-side switches are not limited to those described above. For example, one transmission-side switch and one reception-side switch may be provided. Furthermore, the number of selection terminals or the like of a transmission-side switch and a reception-side switch is not limited to those described in this embodiment. Two selection terminals may be provided for each of a transmission-side switch and a reception-side switch.

Other Embodiments, Etc.

An acoustic wave filter device, a duplexer, a radio frequency front end circuit, and a communication apparatus according to embodiments of the present disclosure have been explained with reference to the first to fifth embodiments and a modification. However, an acoustic wave filter device, a duplexer, a radio frequency front end circuit, and a communication apparatus according to the present disclosure are not limited to any of the foregoing embodiments and modification. Other embodiments implemented by combining desired components in the foregoing embodiments and modification, modifications obtained by performing various changes to the foregoing embodiments conceivable by those skilled in the art without departing from the gist of the present disclosure, and various types of equipment in which an acoustic wave filter device, a duplexer, a radio frequency front end circuit, and a communication apparatus according to the present disclosure are built in are also included in the present disclosure.

For example, an RF front end circuit that includes the acoustic wave filter 10B according to the modification of the first embodiment and a control unit that controls conduction and non-conduction of the plurality of switches SW1 to SW4, the control unit controlling conduction and non-conduction of the plurality of switches SW1 to SW4 individually, is also included in the present disclosure. Accordingly, in the transmission characteristics defined by the ladder filter structure including the series-arm resonator s1 and the parallel-arm resonator p1, by selecting the plurality of switch elements individually, transmission characteristics corresponding to three or more frequency bands (bands) can be selected in an appropriate manner.

Alternatively, an RF front end circuit that includes the power amplifier 24 that amplifies a radio frequency transmission signal, an acoustic wave filter according to any one of the first to third embodiments and the modification that transmits the radio frequency transmission signal amplified by the power amplifier 24, and a control unit that controls conduction and non-conduction of a switch element or a plurality of switch elements is also included in the present disclosure. Accordingly, a front end circuit of a transmission system that includes the power amplifier 24 can be simplified and miniaturized.

Alternatively, an RF front end circuit that includes a control unit that controls conduction and non-conduction of a switch element or a plurality of switch elements, a radio frequency filter circuit that uses the acoustic wave filter according to any one of the first to third embodiments and the modification that transmits a radio frequency reception signal received by an antenna element as a reception-side filter circuit, and a low-noise amplifier that amplifies the radio frequency reception signal output from the radio frequency filter circuit is also included in the present disclosure. Accordingly, a front end circuit of a reception system that includes a low-noise amplifier can be simplified and miniaturized.

Furthermore, a communication apparatus that includes the RFIC 3 that processes a baseband signal or a radio frequency signal and the RF front end circuit is also included in the present disclosure. Accordingly, the communication apparatus can be simplified and miniaturized. The control unit included in the RF front end circuit may be the RFIC 3.

Although explanation has been provided based on the assumption that the acoustic wave filters according to the first to third embodiments and the modification are applied to a system that exclusively switches between frequency bands that are adjacent to each other, the acoustic wave filters may also be applied to a system that exclusively switches between a plurality of channels that are adjacent to each other allocated to a frequency range.

Furthermore, in the acoustic wave filters and the duplexer according to the first to fourth embodiments and the modification, the piezoelectric substrate 50 that configures a surface acoustic wave filter may have a multilayer structure in which a high acoustic velocity supporting substrate, a low acoustic velocity film, and a piezoelectric film are laminated in this order. The piezoelectric film may be, for example, 50° Y-cut, X-propagation LiTaO$_3$ piezoelectric monocrystal or piezoelectric ceramics (lithium tantalate monocrystal or ceramics which is cut along a plane whose normal is defined by an axis that is rotated around an X axis as a central axis by 50 degrees from a Y axis and through which surface acoustic waves propagate in the X-axis direction). The piezoelectric film has a thickness of, for example, 600 nm. The high acoustic velocity supporting substrate is a substrate that supports the low acoustic velocity film, the piezoelectric film, and the IDT electrode 54. The high acoustic velocity supporting substrate is a substrate in which the acoustic velocity of bulk waves is higher than that of acoustic waves of surface acoustic waves or boundary waves propagating in the piezoelectric film, and functions for shutting the surface acoustic waves in a part in which the piezoelectric film and the low acoustic velocity film are laminated so that the surface acoustic waves are not leaked below the high acoustic velocity supporting substrate. The high acoustic velocity supporting substrate is, for example, a silicon substrate and has a thickness of, for example, 200 The low acoustic velocity film is a film in which the acoustic velocity of bulk waves is lower than that of bulk waves propagating in the piezoelectric film and is arranged between the piezoelectric film and the high acoustic velocity supporting substrate. With this structure and the characteristics of acoustic waves whose energy is essentially concentrated in a medium with a low acoustic velocity, leakage of energy of surface acoustic waves to the outside an IDT electrode can be suppressed. The low acoustic velocity film is, for example, a film containing silicon dioxide as a main component and has a thickness of, for example, 670 nm. With this multilayer structure, compared to a structure in which the piezoelectric substrate 50 is used as a single layer, Q values in the resonant frequency and the anti-resonant frequency can be significantly increased. That is, a surface acoustic wave resonator with a large Q value can be configured, and a filter with a low insertion loss can be configured using the surface acoustic wave resonator.

The high acoustic velocity supporting substrate may have a structure in which a supporting substrate and a high acoustic velocity film in which the acoustic velocity of propagating bulk waves is higher than that of acoustic waves of surface acoustic waves and boundary waves propagating in a piezoelectric film, are laminated. In this case, a piezoelectric material such as sapphire, lithium tantalate, lithium niobite, or crystal, various types of ceramics including alumina, magnesia, silicon nitride, aluminum nitride, silicon carbide, zirconia, cordierite, mullite, steatite, and forsterite, dielectric such as glass, a semiconductor or a resin substrate made of silicon, gallium nitride, or the like, and the like may be used as the supporting substrate. Furthermore, various high acoustic velocity materials such as aluminum nitride, aluminum oxide, silicon carbide, silicon nitride, silicon oxynitride, a DLC film, diamond, a medium containing the above material as a main component, a medium containing a mixture of the above materials as a main component, and the like may be used for the high acoustic velocity film.

Furthermore, in the acoustic wave filters and the duplexer according to the first to fourth embodiment and the modification, an inductance element and a capacitance element may further be connected between an input/output terminal and a common terminal.

Furthermore, in the acoustic wave filters and the duplexer according to the first to fourth embodiments and the modification, one resonator is explained for the sake of convenience. However, a plurality of resonators that are divided in series may be configured.

The present disclosure may be widely used, as a compact filter, a duplexer, a front end circuit, and a communication apparatus that may be applied to a multiband and multimode system that exclusively uses bands that are adjacent to each other, for communication equipment such as a cellular phone.

1 antenna element
2 RF front end circuit
3 RF signal processing circuit (RFIC)
10A, 10B, 10C, and 10D acoustic wave filter
10A1 and 10A2 transmission characteristics
10E duplexer
11A, 11B, 11C, 23, 222SW, 223SW, 224SW, 262SW, 263SW, 264SW, 335, 336, 523, 524, SW1, SW2, SW3, SW4, and SW5 switch
12p parallel-arm resonant circuit
12s series-arm circuit
13p1, 13p2, 13p3, 13p4, 13p5, and 13p6 parallel-arm circuit
20B and 20C filter
21a, 21b, and 54 IDT electrode
24 power amplifier
50 piezoelectric substrate
55 protection layer
72p, 73p, 74p, and 75p frequency variable circuit
110 and 120 input/output terminal
210a and 210b electrode fingers
211a and 211b busbar electrode
220c common terminal
220r output terminal
220t input terminal
221p1, 222p1, 222p2, 223p1, 223p2, 224p1, 224p2, 261p1, 262p1, 262p2, 263p1, 263p2, 264p1, 264p2, p1, p11, p1a, p2, p21, p22, p23, p24, p2a, p3a, p3b, p4a, p4b, p5a, p5b, and p6a parallel-arm resonator
221s, 222s, 223s, 224s, 261s, 262s, 263s, 264s, s1, s2, s3, s4, and s5 series-arm resonator
250 longitudinally-coupled resonator
300 communication apparatus
310 switch group
320 filter group
331 transmission-side switch
332, 333, and 334 reception-side switch
341, 342, and 343 transmission amplification circuit
351, 352, 353, and 354 reception amplification circuit
522A filter circuit
522A1 and 522A2 transmission-side filter
541 close contact layer
542 main electrode layer

The invention claimed is:

1. An acoustic wave filter device that switches between first filter characteristics that transmit a radio frequency signal in a first pass band and attenuate a radio frequency signal in a first attenuation band allocated to a higher frequency side than the first pass band and second filter characteristics that transmit a radio frequency signal in a second pass band that is allocated to a higher frequency side than the first pass band and attenuate a radio frequency signal in a second attenuation band allocated to a higher frequency side than the second pass band, the acoustic wave filter device comprising:

a series-arm circuit that is connected between a first input/output terminal and a second input/output terminal; and a parallel-arm resonant circuit that is connected to a node on a path connecting the first input/output terminal to the second input/output terminal and a ground, wherein the parallel-arm resonant circuit includes
a first acoustic wave resonator, and
a frequency variable circuit that is connected in parallel with the first acoustic wave resonator, the frequency variable circuit varying a resonant frequency and an anti-resonant frequency of the parallel-arm resonant circuit, wherein the frequency variable circuit includes
a second acoustic wave resonator that has a resonant frequency higher than a resonant frequency of the first acoustic wave resonator and an anti-resonant frequency higher than an anti-resonant frequency of the first acoustic wave resonator, and
a switch element that is connected in series with the second acoustic wave resonator, wherein switching between the first filter characteristics and the second filter characteristics is performed by switching between conduction state and non-conduction state of the switch element, and wherein a resonant frequency difference, which is a frequency difference between a resonant frequency on a higher frequency side out of two resonant frequencies of the parallel-arm resonant circuit in a case where the switch element is in the non-conduction state, and a resonant frequency on a higher frequency side, out of two resonant frequencies of the parallel-arm resonant circuit in a case where the switch element is in the conduction state, is equal to or more than an attenuation band frequency difference, which is a frequency difference between a low frequency end frequency in the second attenuation band and a low frequency end frequency in the first attenuation band.

2. The acoustic wave filter device according to claim 1, wherein the second acoustic wave resonator is represented by circuit in which a series circuit including an inductor having an inductance $L_2$ and a capacitor having an electrostatic capacitance $C_2$ that are connected in series and a capacitor having an electrostatic capacitance $C_{02}$ are connected in parallel, and wherein in a case where the attenuation band frequency difference is represented by $\Delta f_{FIL}$, an off capacitance $C_{off}$, which is an electrostatic capacitance of the switch element in the case where the switch element is in the non-conduction state, satisfies a relational expression:

$$C_{\textit{off}} \le \frac{L_2 C_{02} C_2 \left(2\pi\Delta f_{FIL} + \frac{1}{\sqrt{L_2 C_2}}\right)^2 - C_{02} - C_2}{1 - L_2 C_2 \left(2\pi\Delta f_{FIL} + \frac{1}{\sqrt{L_2 C_2}}\right)^2}.$$

3. The acoustic wave filter device according to claim 2, wherein the off capacitance $C_{\textit{off}}$ is smaller than the electrostatic capacitance $C_{02}$.

4. A radio frequency front end circuit comprising:
the acoustic wave filter device according to claim 2;
a low-noise amplifier that amplifies a radio frequency reception signal output from the acoustic wave filter device; and
a control unit that controls switching between the conduction state and the non-conduction state of the switch element.

5. The acoustic wave filter device according to claim 1, wherein the series-arm circuit includes
a series-arm resonator that is connected between the first input/output terminal and the second input/output terminal,
wherein the resonant frequency of the first acoustic wave resonator is lower than a resonant frequency of the series-arm resonator, and
wherein the resonant frequency of the second acoustic wave resonator is higher than the resonant frequency of the first acoustic wave resonator.

6. The acoustic wave filter device according to claim 5, wherein the resonant frequency of the second acoustic wave resonator is higher than the resonant frequency of the series-arm resonator and lower than an anti-resonant frequency of the series-arm resonator.

7. The acoustic wave filter device according to claim 1, further comprising a plurality of frequency variable circuits each including a second acoustic wave resonator and a switch element connected in series, wherein the plurality of frequency variable circuits are connected in parallel between the node and the ground.

8. The acoustic wave filter device according to claim 1, further comprising:
a longitudinally-coupled filter circuit that is arranged between the first input/output terminal and the second input/output terminal.

9. The acoustic wave filter device according to claim 1, wherein the first acoustic wave resonator and the second acoustic wave resonator are surface acoustic wave resonators or acoustic wave resonators using a BAW resonator.

10. The acoustic wave filter device according to claim 1, wherein the first acoustic wave resonator and the second acoustic wave resonator include IDT electrodes provided on substrates having same piezoelectric characteristics.

11. The acoustic wave filter device according to claim 1, wherein the switch element is a GaAs or CMOS FET switch or a diode switch.

12. A duplexer comprising a transmission-side filter circuit and a reception-side filter circuit,
wherein one of the transmission-side filter circuit or the reception-side filter circuit includes the acoustic wave filter device according to claim 1.

13. A radio frequency front end circuit comprising:
a power amplifier that amplifies a radio frequency transmission signal;
the duplexer according to claim 12 that transmits the radio frequency transmission signal amplified by the power amplifier; and
a control unit that controls switching between the conduction state and the non-conduction state of the switch element.

14. A radio frequency front end circuit comprising:
the duplexer according to claim 12 that transmits a radio frequency reception signal received by an antenna element;
a low-noise amplifier that amplifies the radio frequency reception signal output from the duplexer; and
a control unit that controls switching between the conduction state and the non-conduction state of the switch element.

15. A radio frequency front end circuit comprising:
the acoustic wave filter device according to claim 1;
a low-noise amplifier that amplifies a radio frequency reception signal output from the acoustic wave filter device; and
a control unit that controls switching between the conduction state and the non-conduction state of the switch element.

16. The acoustic wave filter device according to claim 1, wherein the acoustic wave filter device includes a plurality of stages of filter structure, each of the plurality of stages including a series-arm circuit and a parallel-arm circuit, and
wherein two or more of the plurality of parallel-arm circuits are parallel-arm resonant circuits each including the first acoustic wave resonator, the second acoustic wave resonator, and the switch element.

17. A radio frequency front end circuit comprising:
the acoustic wave filter device according to claim 16; and
a control unit that controls switching between conduction state and non-conduction state of the plurality of switch elements,
wherein the control unit controls switching between the conduction state and the non-conduction state of the plurality of switch elements individually.

18. A communication apparatus comprising:
an RF signal processing circuit that processes a baseband signal or a radio frequency signal; and
the radio frequency front end circuit according to claim 17.

19. A radio frequency front end circuit comprising:
a power amplifier that amplifies a radio frequency transmission signal;
the acoustic wave filter device according to claim 1; and
a control unit that controls switching between the conduction state and the non-conduction state of the switch element.

20. A communication apparatus comprising:
an RF signal processing circuit that processes a baseband signal or a radio frequency signal; and
the radio frequency front end circuit according to claim 19.

* * * * *